United States Patent
Yoshida et al.

(10) Patent No.: US 7,075,163 B2
(45) Date of Patent: Jul. 11, 2006

(54) ELECTROMAGNETIC NOISE SUPPRESSOR, SEMICONDUCTOR DEVICE USING THE SAME, AND METHOD OF MANUFACTURING THE SAME

(75) Inventors: Shigeyoshi Yoshida, Abiko (JP); Hiroshi Ono, Yokohama (JP); Yoshio Awakura, Yokohama (JP); Michio Nemoto, Sendai (JP); Eiji Yamanaka, Sendai (JP); Masahiro Yamaguchi, Sendai (JP); Yutaka Shimada, Sendai (JP)

(73) Assignee: NEC TOKIN Corporation, miyagi (JP)

( * ) Notice: Subject to any disclaimer, the term of this patent is extended or adjusted under 35 U.S.C. 154(b) by 0 days.

(21) Appl. No.: 09/826,383

(22) Filed: Apr. 4, 2001

(65) Prior Publication Data

US 2002/0030249 A1    Mar. 14, 2002

(30) Foreign Application Priority Data

| Apr. 4, 2000 | (JP) | ............................. 2000-101895 |
| Nov. 2, 2000 | (JP) | ............................. 2000-340406 |
| Nov. 10, 2000 | (JP) | ............................. 2000-342789 |
| Nov. 10, 2000 | (JP) | ............................. 2000-342835 |

(51) Int. Cl.
*H01L 27/14* (2006.01)
*H01L 31/00* (2006.01)
*H01L 21/00* (2006.01)

(52) U.S. Cl. ...................... 257/428; 257/659; 257/660

(58) Field of Classification Search ................. 257/428, 257/659, 660
See application file for complete search history.

(56) References Cited

U.S. PATENT DOCUMENTS

| 3,783,499 A | | 1/1974 | Hughes, Jr. |
| 3,963,489 A | * | 6/1976 | Cho ............................. 430/22 |
| 4,771,347 A | * | 9/1988 | Horimai et al. ............... 360/59 |
| 5,373,627 A | | 12/1994 | Grebe |
| 5,408,123 A | | 4/1995 | Murai |
| 5,639,989 A | * | 6/1997 | Higgins, III ........... 174/35 MS |
| 5,698,284 A | * | 12/1997 | Kubota et al. ............. 428/64.7 |
| 5,831,324 A | | 11/1998 | Bang |
| 6,069,820 A | * | 5/2000 | Inomata et al. ............. 365/171 |

(Continued)

FOREIGN PATENT DOCUMENTS

EP    0 785 557 A1    7/1997

(Continued)

OTHER PUBLICATIONS

Takahashi SoJi, Patent Abstracts Of Japan, "Wiring structure of semiconductor integrated circuit and forming method" U.S. Appl. No. 09/326,587, filed Dec. 16, 1997.*

(Continued)

*Primary Examiner*—W. David Coleman
*Assistant Examiner*—Kheim Nguyen
(74) *Attorney, Agent, or Firm*—Bradley N. Ruben

(57) ABSTRACT

In a semiconductor bare chip (57) on the front surface whereof is formed an integrated circuit, a magnetic loss film 55 is formed on the back surface of that semiconductor bare chip.

25 Claims, 16 Drawing Sheets

U.S. PATENT DOCUMENTS

| | | | |
|---|---|---|---|
| 6,303,227 B1* | 10/2001 | Kuwahara et al. | 428/421 |
| 6,452,253 B1* | 9/2002 | Tuttle | 257/659 |
| 6,473,024 B1* | 10/2002 | Toyoda et al. | 342/1 |
| 6,515,352 B1* | 2/2003 | Spielberger et al. | 257/659 |
| 6,521,150 B1* | 2/2003 | Maeda et al. | 264/102 |
| 6,648,990 B1* | 11/2003 | Yoshizawa | 148/313 |
| 6,653,573 B1* | 11/2003 | Awakura et al. | 174/256 |
| 6,703,778 B1* | 3/2004 | Watanabe et al. | 313/479 |
| 6,719,615 B1* | 4/2004 | Molnar | 451/41 |
| 6,738,240 B1* | 5/2004 | Ahn et al. | 361/38 |
| 6,740,289 B1* | 5/2004 | Ono et al. | 419/65 |
| 6,972,097 B1* | 12/2005 | Yoshida et al. | 252/62.54 |
| 2002/0189718 A1* | 12/2002 | Yoshizawa | 148/313 |
| 2004/0048092 A1* | 3/2004 | Yasui et al. | 428/642 |

FOREIGN PATENT DOCUMENTS

JP  10128140  11/1999

OTHER PUBLICATIONS

European Search Report dated Aug. 13, 2001.

Liau, V.S., et al., "Tunable Band-Stop Filter Based on Epitaxial Fe Film on GaAS," Microwave Symp. Digest, IEEE MTT-S Int'l, Boston, Jun. 1991, pp. 957-960.

Sato, T., et al., "Transmission-line Low-pass Filter for Switching Power Supplies," PESC '98, 29th Ann. IEEE Power Elect. Spec. Conf., IEEE vol. 2, pp. 1972-1978, 1998.

* cited by examiner

DEVICE SURFACE

ELECTROMAGNETIC NOISE SUPPRESSOR, SEMICONDUCTOR DEVICE USING THE SAME, AND METHOD OF MANUFACTURING THE SAME

BACKGROUND OF THE INVENTION

1. Field of the Invention

This invention relates to semiconductor substrates used in the manufacture of various semiconductor devices for industrial and everyday use, and to semiconductor bare chips and semiconductor wafers on the surface whereof are formed integrated circuits, and more particularly to noise-suppressed electromagnetic wave absorbing semiconductor substrates and manufacturing method therefor, together with semiconductor devices manufactured using such semiconductor substrates.

The present invention also relates to an electromagnetic noise suppression body that exhibits outstanding high-frequency electromagnetic noise suppression effects, and more particularly to an electromagnetic noise suppression body that is effective in suppressing electromagnetic noise that is problematic in active devices that operate at high speeds or high-frequency electronic components and electronic equipment, and to a high-frequency electromagnetic noise suppression method using such body.

2. Description of the Related Art

The proliferation of highly integrated semiconductor devices that operate at high speed has been remarkable in recent years. Examples include the random access memory (RAM), read only memory (ROM), microprocessor (MPU), central processing unit (CPU), image processing arithmetic logic unit (IPALU), and other logic circuit devices. In these active devices, higher speeds are being achieved at a prodigious rate in terms of calculating speed and signal processing speed, and the electrical signals propagated through the high-speed electronic circuits have become a major cause of inductive and high-frequency noise because of the rapid voltage and current changes associated therewith.

Meanwhile, the trend toward lighter weight, thinner profile, and smaller size in electronic components and electronic equipment continues rapidly and unabatedly. In conjunction with that trend, the integration levels being achieved in semiconductor devices and the higher electronic component mounting densities being realized in printed wiring substrates are also remarkable. Accordingly, electronic devices and signal lines that are integrated or mounted overly densely become extremely close to each other, and the situation is now such that, in conjunction with the higher signal processing speeds being achieved, as remarked earlier, high-frequency spurious radiation noise is easily induced.

With conventional semiconductor substrates, no anti-noise measures are effected in the substrate itself. Therefore, when noise is generated from a semiconductor device circuit pattern region after the semiconductor device has been fabricated, noise leaks out to the outside as it is, and sometimes causes operating errors in other devices or equipment.

That being so, what has been done in terms of anti-noise measures for the semiconductor devices has been to apply an electromagnetic wave absorbing material to the back side of each individual semiconductor device, or something like that, to form an additional electromagnetic wave absorption layer.

With such conventional semiconductor device anti-noise measures as this, however, there is a problem in that the noise absorbing material, such as electromagnetic wave absorbing material, must be applied to the back side of each individual semiconductor device in a post-process, wherefore an enormous amount of time is required in the process to implement the anti-noise measure. Also, because they are applied to the back side of each individual semiconductor device, variation readily develops in the thickness of the noise absorbing members, such as electromagnetic wave absorbing material, and variation also develops in the noise absorption characteristics of the individual semiconductor devices, which also constitutes a problem.

As is commonly known, moreover, semiconductor bare chips that configure semiconductor devices, on the surface whereof are formed integrated circuits, are obtained by cutting semiconductor wafers that are semiconductor substrates.

Problems have been pointed out in connection with spurious radiation from power supply lines in such semiconductor bare chips, against which such measures as the insertion of decoupling capacitors or other concentrated constant components into the power lines have been implemented. Problems have also been pointed out in connection with spurious radiation from power supply lines going to active devices in electronic integrated devices and wiring substrates, against which such measures as the insertion of decoupling capacitors or other concentrated constant components into the power lines have been similarly implemented.

However, in semiconductor bare chips, electronic integrated devices and wiring substrates on the surfaces of which higher speed implementations integrated circuits are formed, the noise generated contains harmonic components, and therefore signal paths have come to exhibit a distributed constant behavior. As a result, situations have arisen where measures against noise that presume conventional concentrated constant circuits are ineffective.

Accordingly, there has been a need to develop electromagnetic noise suppression bodies that are effective in measures to suppress electromagnetic noise in such semiconductor devices and electronic circuits that operate at high speeds. More particularly, what has been needed is the development of electromagnetic noise suppression bodies capable of implementing measures against electromagnetic noise effectively with smaller volume.

SUMMARY OF THE INVENTION

It is an object of the present invention to provide a semiconductor substrate capable of efficiently absorbing interfering electromagnetic waves from the MHz bands to the GHz bands, capable of exhibiting an electromagnetic wave absorption effect when divided into individual semiconductor devices, and excelling in the volume production of noise-suppressed semiconductor devices, together with a manufacturing method therefore and semiconductor devices wherein those semiconductor substrates are used.

It is another object of the present invention to provide semiconductor bare chips and semiconductor wafers capable of effectively reducing spurious radiation generated from integrated circuits, in semiconductor bare chips and semiconductor wafers on the surface whereof are formed such integrated circuits that operate at high speeds.

Yet another object of the present invention is to provide an electromagnetic noise suppression body for implementing non-reflecting electromagnetic noise suppression in minute electronic circuits such as are found inside semiconductor devices, even when also using electrically conductive magnetic thin films exhibiting outstanding magnetic loss characteristics, together with an electromagnetic noise suppression method using that body.

According to one aspect of the present invention, there is provided a semiconductor bare chip which has an integrated circuit formed on the surface thereof. In the aspect of the present invention, a magnetic loss film is formed on the back side of that semiconductor bare chip.

According to another aspect of the present invention, there is provided a semiconductor wafer which has an integrated circuit formed on the surface thereof. In the aspect of the present invention, a magnetic loss film is formed on the back side of that semiconductor wafer.

According to still another aspect of the present invention, there is provided a semiconductor substrate which has a magnetic loss member formed in a part thereof. In the aspect of the present invention, the magnetic loss member is formed in a prescribed pattern in the vicinity of the surface on one of the semiconductor substrate. The magnetic loss member and the semiconductor substrate region on that surface are uniformly covered with an insulating film.

According to a yet another aspect of the present invention, there is provided a semiconductor substrate formed by attaching a first semiconductor substrate member and a second semiconductor substrate member together and having a magnetic loss member formed in a part thereof. In the aspect of the present invention, at least one or other semiconductor substrate member of the first semiconductor substrate member and the second semiconductor substrate member is provided with a trench, which is formed on the surface that is on the side joined together, and in which the magnetic loss member is embedded in such trench.

According to a further aspect of the present invention, there is provided a semiconductor substrate manufacturing method which comprises a process for forming a layer comprising a magnetic loss member in at least a part of the semiconductor substrate.

According to a still further aspect of the present invention, there is provided an electromagnetic noise suppressing body which comprises an electrically conductive soft magnetic thin film, and has a structure in which the soft magnetic thin film is finely divided into configuring units sufficiently small relative to the wavelength of the electromagnetic noise. DC current conduction between those configuring units is interrupted.

According to a yet further aspect of the present invention, there is an electromagnetic noise suppression method, by which conductive electromagnetic noise is suppressed by forming the electromagnetic noise suppression body noted above immediately above a microstrip line or signal transmission line similar thereto.

According to another aspect of the present invention, there is provided an electromagnetic noise suppression body for suppressing conductive electromagnetic noise which comprises an electrically conductive soft magnetic thin film formed in vicinity above a microstrip line or signal transmission line similar thereto. In the aspect of the present invention,the electrically conductive soft magnetic thin film is shaped such that the width thereof is substantially equivalent to or narrower than the line width of the microstrip line or signal transmission line similar thereto.

According to still another aspect of the present invention, there is provided a conductive noise suppression method for controlling conductive electromagnetic noise by forming an electromagnetic noise suppression body which comprises an electrically conductive soft magnetic thin film in vicinity above a microstrip line or signal transmission line similar thereto. In the aspect of the present invention, the electrically conductive soft magnetic thin film is shaped such that the width thereof is substantially equivalent to or narrower than the line width of the microstrip line or signal transmission line similar thereto.

DESCRIPTION OF THE PREFERRED EMBODIMENTS

First, before describing the embodiments of the present invention, in order to facilitate comprehension of the present invention, semiconductor wafers based on the prior art are described with reference to FIGS. 1 to 5.

Figure 1A:
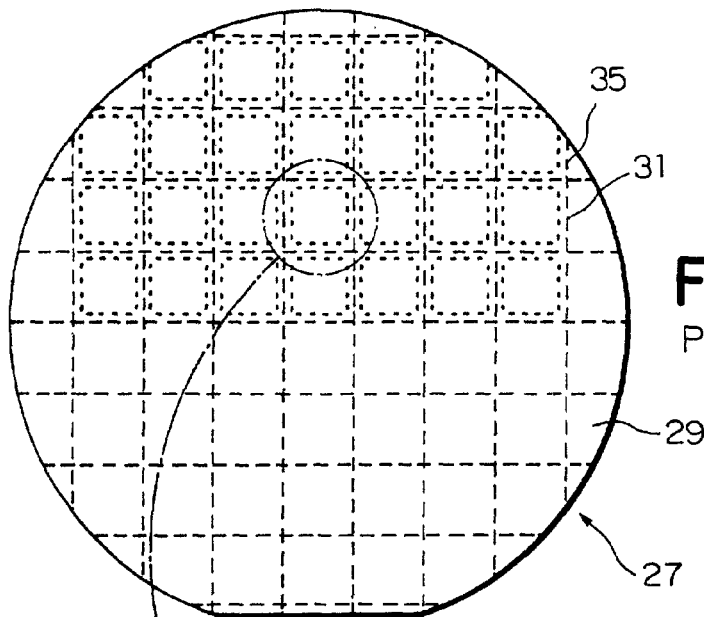
FIG. 1A is a plan of a conventional semiconductor wafer.
Figure 1B:
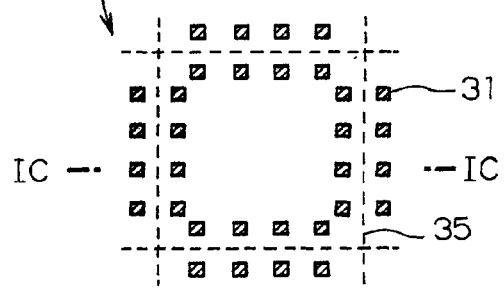
FIG. 1B is an enlarged view of the circled part in FIG. 1A.
Figure 1C:
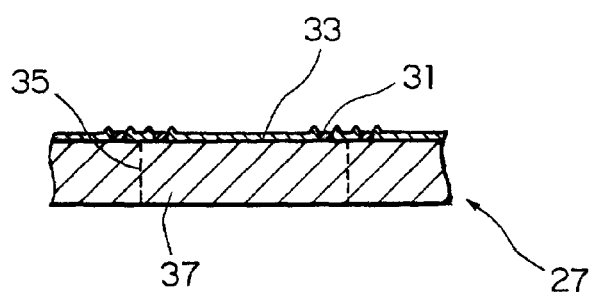
FIG. 1C is a section cut at the IC—IC line in FIG. 1B.

Referring to FIGS. 1A, 1B, and 1C, a semiconductor bare chip is made using commonly known wafer manufacturing technology, for example. A semiconductor wafer 27 has a plurality of chip wafers 29 on the surface of each whereof is formed an integrated circuit (not shown), and each whereof has a chip 31 electrode (electrode pad) formed on top thereof. The chip electrodes 31 as diagrammed are formed along the outer circumferential edge of the chip wafers 29, but the chip electrodes 31 may be formed in active areas. An aluminum alloy is commonly used for the metal of which the chip electrodes are formed. The semiconductor wafer 27 also comprises a passivation film 33. More specifically, the entire surface of the semiconductor wafer 27 is covered by the passivation film 33. The passivation film 33 is made of a polyimide, silicon nitride film, or silicon oxide film, for example, using a well known technique such as spin coating. The thickness of the passivation film 33 should be 20 μm or less. After the passivation film 33 has been formed, the chip electrodes 31 are exposed to atmospheric air by exposing and etching the semiconductor wafer 27. As a result, the passivation film 33 will cover the entire surface of the semiconductor wafer 27 excluding those positions where the chip electrodes 31 are formed. The chip wafers 29 are then mutually separated into individual semiconductor bare chips along scribe lines 35. That separation is done by means of a commonly known dicing technique using a dicing saw. These chip wafers 29 are semiconductor bare chips 37.

Figure 2A:
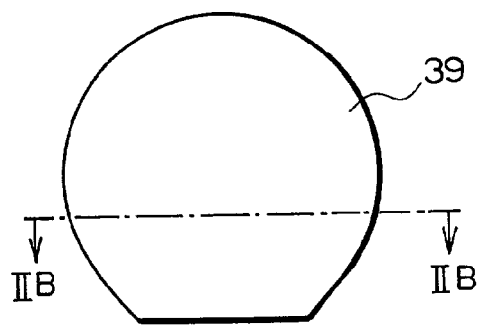
FIG. 2A is a general plan view of a conventional semiconductor substrate.
Figure 2B:
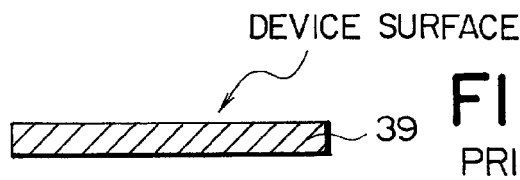
FIG. 2B is a section at the IIB—IIB line in FIG. 2A.

Referring to FIGS. 2A and 2B, the semiconductor substrate 39 has silicon as its basic material, with the semiconductor substrate here shown in the initial condition of a semiconductor device manufacturing process. By subjecting the semiconductor substrate 39 to various commonly known semiconductor manufacturing processes, the semiconductor substrate diagrammed in FIGS. 3A and 3B whereon are formed the individual semiconductor device circuit patterns described earlier is obtained.

Figure 3A:
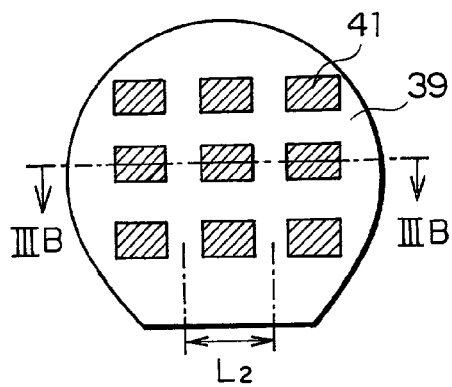
FIG. 3A is a plan representing the final form of a semiconductor substrate after subjecting a conventional semiconductor substrate to various semiconductor manufacturing processes.
Figure 3B:
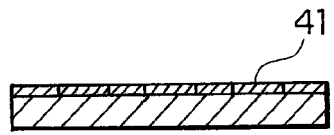
FIG. 3B is a section at the IIIB—IIIB line in FIG. 3A.

Referring to FIGS. 3A and 3B, the individual circuit pattern areas 4A in the semiconductor substrate 39 correspond to the functional portions of the several semiconductor devices. By cutting the individual semiconductor devices inclusive of their respective circuit pattern areas 41 away from the semiconductor substrate 39, the several semiconductor devices are fabricated.

Figure 4A:
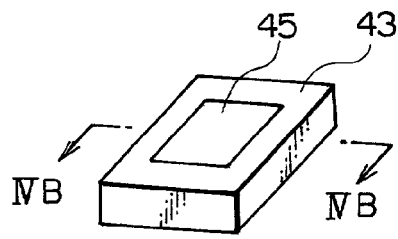
FIG. 4A is a general perspective view of one semiconductor device completed after cutting a conventional semiconductor substrate.
Figure 4B:
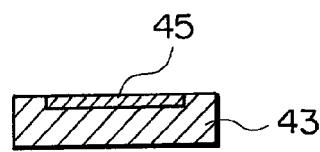
FIG. 4B is a section at the IVB—IVB line in FIG. 4A.

Referring to FIG. 4, with a conventional semiconductor substrate 39, no anti-noise measures are effected in the substrate itself. For that reason, after fabricating a semiconductor device 43, if noise is produced from the circuit pattern area 45 of the semiconductor device 43, the noise will leak out to the outside as it is, and in some cases cause erroneous operations in other devices or equipment.

Figure 5A:
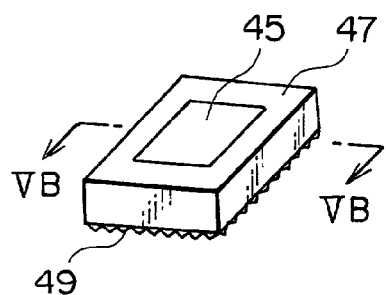
FIG. 5A is a general perspective view subsequent to anti-noise measures, provided to describe an example of an anti-no99ise measure in a conventional semiconductor device.
Figure 5B:
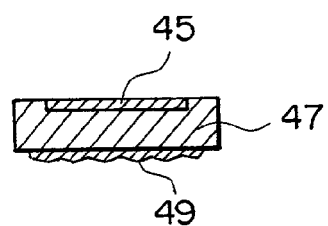
FIG. 5B is a section at the VB—VB line in FIG. 5A.

Referring to FIGS. 5A and 5B, what has been done to the semiconductor devices in terms of anti-noise measures has been to apply an electromagnetic wave absorbing material to the back side of each individual semiconductor device, or something like that, to form an additional electromagnetic wave absorption layer. With the semiconductor device 47 diagrammed in FIGS. 5A and 5B, after cutting the individual semiconductor devices away from the semiconductor substrate, an electromagnetic wave absorbing material 49 has been applied to the back side of the semiconductor 47, that is, the surface on the side whereon the circuit pattern area 45 is not formed, or something like that has been done, to form an additional electromagnetic wave absorption layer.

However, with the anti-noise measure in this conventional semiconductor device 47, there is a problem in that an enormous amount of time is required to implement the anti-noise measure, in a post-process wherein the noise absorbing member, i.e. electromagnetic wave absorption material 49, is applied to the back side of each and every semiconductor device 47. Also, because they are applied to the back side of each individual semiconductor device, variation readily develops in the thickness of the noise absorbing members, i.e. electromagnetic wave absorbing material 49, and variation also develops in the noise absorption characteristics of the individual semiconductor devices, which is another problem.

A brief history of the present invention is given next.

The inventors, having previously invented a composite magnetic body exhibiting large magnetic loss at high frequencies, discovered a method wherewith, by forming the composite magnetic body in the vicinity of a spurious radiation source, the generation of spurious radiation from the semiconductor devices and electronic circuits noted earlier, etc., is effectively suppressed. It is known from recent research on the active mechanism of spurious radiation attenuation using such magnetic loss that this is due to the fact that equivalent resistance components are imparted to the electronic circuits constituting sources of spurious radiation. Here, the equivalent resistance is dependent on the magnetic loss factor $\mu''$ of the magnetic body as given by an imaginary part of the complex permeability. More specifically, the resistance value of resistor component that is equivalently inserted in an electronic circuit is substantially proportional to $\mu''$ and the thickness of the magnetic body when the area of the magnetic body is constant. Accordingly, a larger $\mu''$ becomes necessary in order to obtain a desired spurious radiation attenuation with a smaller or thinner magnetic body. For example, in order to effect measures against spurious radiation using a magnetic loss body in a miniscule region, such as in the interior of a semiconductor device mold, an extremely large value for the magnetic loss factor becomes necessary, whereupon magnetic bodies having significantly larger $\mu''$ than conventional magnetic loss materials have been sought. The present invention was devised in view of that situation.

The inventors, moreover, in the course of their research on soft magnetic materials using sputtering or vapor deposition methods, took note of the outstanding permeability of granular magnetic bodies wherein very fine magnetic metal particles are diffused uniformly in a non-magnetic body such as a ceramic, and conducted research on the microstructures of magnetic metal particles and the non-magnetic bodies surrounding them. As a result, the inventors discovered that outstanding magnetic loss characteristics are obtained in high-frequency regions when the concentration of magnetic metal particles in a granular magnetic body is within a certain range. Much research has been done to date on granular magnetic bodies having M-X—Y compositions, where M is a magnetic metal element, Y is either O, N, or F, and X is an element other than M or Y, and it is known that these are low-loss and exhibit large saturation magnetization. In these M-X—Y granular magnetic bodies, the saturation magnetization is dependent on the volume ratio accounted for by the M component. Therefore, the ratio of the M component must be made high to obtain large saturation magnetization. For that reason, the ratio of the M component in an M-X—Y granular magnetic body for an ordinary application, such as use as a magnet core in a high-frequency inductor device or transformer or the like has been limited to a range wherewith a saturation magnetization of substantially 80% or greater can be realized for the saturation magnetization of the bulk metal magnetic body consisting exclusively of the M component.

The inventors studied the ratio of the M component in granular magnetic bodies having the M-X—Y composition, where M is a magnetic metal element, Y is either O, N, or F, and X is an element other than M or Y, across a wide range, discovering, as a result, that, with every composition system, large magnetic loss is exhibited in high-frequency regions when the magnetic metal M is present within a specific concentration range, and thus arrived at the present invention.

The highest region, where the M component exhibits a saturation magnetization of 80% or greater relative to the saturation magnetization of a bulk metal magnetic body consisting exclusively of the M component, is the M-X—Y granular magnetic body region of low loss at high saturation magnetization that has been widely researched for some time. Materials in this region are used in high-frequency micromagnetic devices, such as the high-frequency inductors mentioned above, because the values of the real-part permeability ($\mu'$) and the saturation magnetization are both large, but the ratio accounted for by the X—Y component that affects electrical resistance is small, wherefore electrical resistivity is also small. For that reason, when the film thickness becomes thin, the permeability at high frequencies deteriorates in conjunction with the development of eddy current loss in the high-frequency region, wherefore these materials are unsuitable for use in comparatively thick magnetic films such as are used to suppress noise. In the region for the M component ratio exhibiting a saturation magnetization of 80% or less but 60% or more of the saturation magnetization of a bulk metal magnetic body consisting of only the M component, the electrical resistivity is comparatively large at substantially 100 $\mu\Omega\cdot$cm or greater. Therefore, even if the thickness of the material is on the order of several $\mu$m, the loss due to eddy currents is small, and almost all of the magnetic loss will be due to natural resonance. For that reason, the frequency dispersion width for the magnetic loss factor $\mu''$ will become narrow, wherefore such materials are suitable for anti-noise measures in narrow-band frequency ranges. In the region for the M component ratio exhibiting a saturation magnetization that is 60% or less but 35% or greater of the saturation magnetization of a bulk metal magnetic body consisting solely of the M component, the electrical resistivity will be even larger, at substantially 500 $\mu\Omega\cdot$cm or greater, so the loss due to eddy currents will be extremely small, and, because the magnetic interaction between M component becomes small, spin thermal disturbance becomes large, and quivering develops in the frequency where natural resonance occurs. As a consequence, the magnetic loss factor $\mu''$ will come to exhibit a large value across a broad range. Accordingly, this composition region is suitable for wide-band high-frequency current suppression.

In regions where the M component ratio is even smaller than in the region of the present invention, on the other hand, super-normal magnetism will occur because the magnetic interaction between M components will hardly appear at all.

When a magnetic loss material is formed immediately adjacent to an electronic circuit and high-frequency current is to be suppressed, the material design standard is given by the product of the magnetic loss factor $\mu''$ and the thickness $\delta$ of the magnetic loss material, that is, $\mu''\cdot\delta$, and, in order to effectively suppress the high-frequency current at a frequency of several hundreds of MHz, the rough requirement will be $\mu''\cdot\delta \geq 1000$ ($\mu$m). Accordingly, with a magnetic loss material exhibiting $\mu''=1000$, a thickness of 1 $\mu$m or greater becomes necessary, whereupon a material of low electrical resistance susceptible to eddy current loss is not suitable, but what is suitable is a composition wherewith the electrical resistivity becomes 100 $\mu\Omega$cm or greater, that is, in the composition system of the present invention, wherein the M component ratio is in a region where a saturation magnetization is exhibited that is 80% or lower than the saturation magnetization of a bulk metal magnetic body consisting solely of the M component and super-normal magnetism is not manifest, that is, a region exhibiting a saturation magnetization that is 35% or greater relative to the saturation magnetization of the bulk metal magnetic body consisting solely of the M component.

The present invention is an invention wherein a magnetic loss film, such as the granular magnetic thin film described above, is applied. By "granular magnetic thin film" is meant a magnetic thin film that exhibits very large magnetic loss at high frequencies from several tens of MHz to several GHz, the fine structure whereof exhibits a very fine particle diameter of from several nm to several tens of nm. Such a film is also called a "microcrystalline thin film" in this technical field.

Embodiments of the present invention will be now described with reference to the drawings.

Figure 6A:
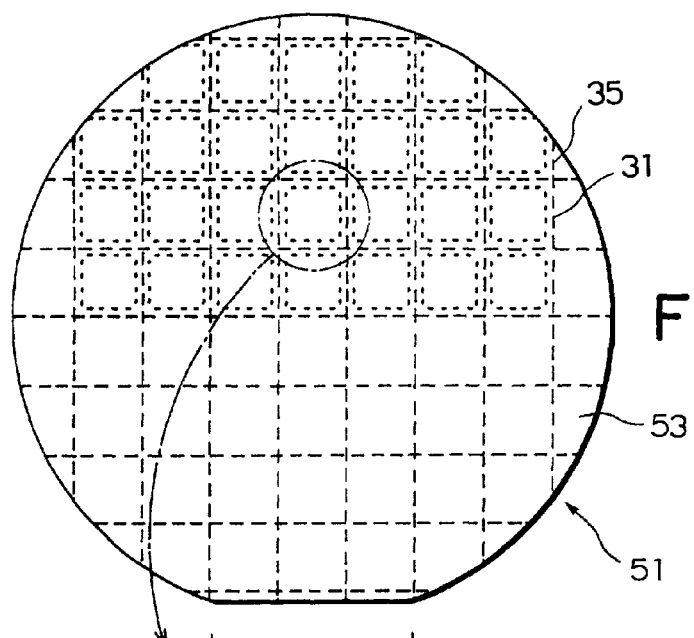
FIG. 6A is a plan of a semiconductor wafer in one embodiment of the present invention.
Figure 6B:
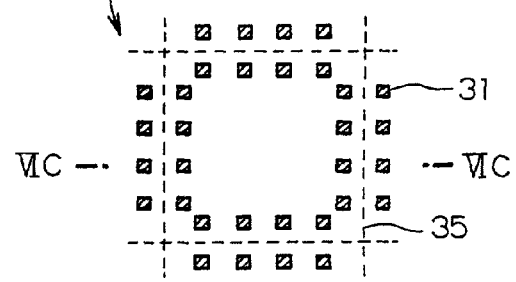
FIG. 6B is an enlarged view of the circled part in FIG. 6A.
Figure 6C:
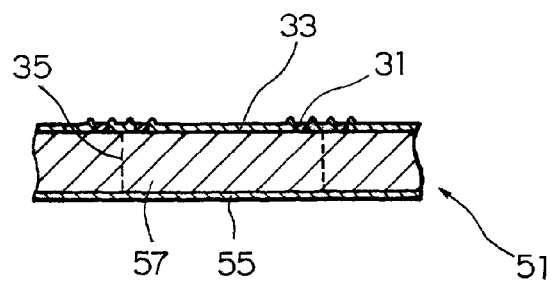
FIG. 6C is a section cut at the VIB—VIB line in FIG. 6B.

Referring to FIGS. 6A to 6C, a semiconductor wafer according to one embodiment of the present invention will be described.

The semiconductor wafer 51 diagrammed has the same configuration as the semiconductor wafer diagrammed in FIG. 1 except in that that here the back side thereof is covered with a magnetic loss film 55. Elements having the same function as diagrammed in FIG. 1 are indicated by the same reference symbols, and, to avoid redundant description, no further description thereof is given here.

The chip portions 53 are mutually divided into individual semiconductor bare chips along the scribe lines 35. That division is done by a commonly known dicing technique using a dicing saw. These chip portions 53 are semiconductor bare chips 57.

Here, for the magnetic loss film 55, the granular magnetic thin film can be used which was proposed by the present inventors in International Patent Application No. PCT/JP01/00437 filed on Jan. 24, 2001 corresponding to Japanese patent application No. 2000-52507 filed on Jan. 24, 2000, hereinafter called the "prior application". Such a granular magnetic thin film can be manufactured by the used of a sputtering method, reactive sputtering method, or vapor deposition method, as described in the specification in the prior application. In other words, the granular magnetic thin film may be a sputtered film formed by sputtering or reactive sputtering, or, alternatively, a vapor-deposited film formed by vapor deposition. Actually, when manufacturing the granular magnetic thin film, such a sputtered film or vapor-deposited film is subjected to a heat treatment in a vacuum magnetic field at a prescribed temperature for a prescribed time.

Please refer to the prior application for a detailed description of the method of manufacturing the granular magnetic thin film.

The inventors have already verified in tests that the granular magnetic thin film formed in this manner exhibits very large magnetic loss at high frequencies of from several tens of MHz to several GHz, even with a thin film thickness, such as 2.0 $\mu$m or less, for example.

The inventors also have already verified in tests that the granular magnetic thin film according to the present invention and exhibiting a $\mu''$ dispersion in the sub-microwave band exhibits the same order of high-frequency current suppression effect as a composite magnetic sheet having approximately 500 times the thickness. Accordingly, the granular magnetic thin film relating to the present invention is promising as a material for use in anti-EMI measures in semiconductor integrated devices and the like that operate with a high clock speed near 1 GHz.

Figure 7:
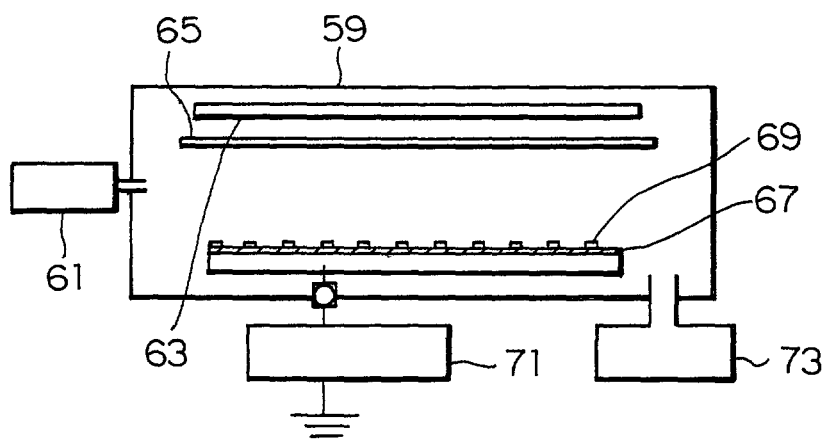
FIG. 7 is a schematic section of a sample fabricating apparatus that uses a sputtering method.

Next, referring to FIG. 7, a sputtering manufacturing apparatus is described as an example of an apparatus for manufacturing a granular magnetic thin film as the magnetic loss film 55. This sputtering manufacturing apparatus comprises a vacuum chamber 59, and a gas supply unit 61 and vacuum pump 23 connected to the chamber. In the chamber 59, a substrate 63 and target 67 are formed in opposition with an intervening shutter 65. The target 67 consists of the component M wherein chips 69 consisting of the components X and Y, or the component X, formed at prescribed intervals. On the support side of the chips 69 and target 67 is connected one end of a RF power supply 71, with the other end of the RF power supply 71 grounded.

Next, an example of manufacturing a granular magnetic thin film, sample 1, using a sputtering manufacturing apparatus of such a configuration will be described.

First, a total of 120 $Al_2O_3$ chips with dimensions=5 mm in height×5 mm in width×2 mm in thickness were formed on a circular plate made of iron having a diameter $\phi$=100 mm (the target 67). Then, with the interior of the vacuum chamber 59 maintained with a vacuum of approximately $1.33\times10^{-4}$ Pa by the vacuum pump 73, argon gas was supplied to the vacuum chamber 69 by the gas supply unit 61, and thus an argon gas atmosphere was created inside the vacuum chamber 59. In this condition, high-frequency electrical power is supplied by the RF power supply 26. Under conditions such as these, a magnetic thin film was formed by sputtering on a glass substrate to form the substrate 63. Then the magnetic thin film obtained was subjected to a heat treatment for 2 hours in a vacuum magnetic field under temperature conditions of 300° C. to yield the sample 1 according to the granular magnetic thin film described earlier.

When the sample 1 obtained thusly was subjected to fluoroscopic x-ray analysis, it was found to have an $Fe_{72}Al_{11}O_{17}$ composition, with a film thickness of 2.0 $\mu$m and DC resistivity of 530 $\mu\Omega$·cm. The anisotropic electric field $H_k$ of sample 1 was 18 (Oe), and the saturation magnetization $M_s$ was 1.68 T (teslas). Furthermore, in sample 1, a relative bandwidth bwr was 148%. The relative bandwidth bwr is obtained by extracting a frequency bandwidth between two frequencies at which the value of $\mu''$ (the magnetic loss factor or the imaginary part of the complex permeability) is 50% of the maximum $\mu''_{max}$ and normalizing the frequency bandwidth at the center frequency thereof. The ratio between the sample 1 saturation magnetization $M_S$ (M-X—Y) and the saturation magnetization $M_S$ (M) of the metal magnetic body consisting only of the component M, namely $\{M_S(M-X-Y)/M_S(M)\}\times100\%$, was 72.2%.

In order to verify the magnetic loss characteristics of sample 1, the permeability μ characteristics (μ-f response) was investigated as follows. The μ-f response was measured by inserting sample 1 in a detection coil fashioned in a ribbon shape, and the impedance was measured while applying a bias magnetic field. Based on these results, the frequency response of the magnetic loss factor μ" (μ"-f response) was obtained.

Figure 8:
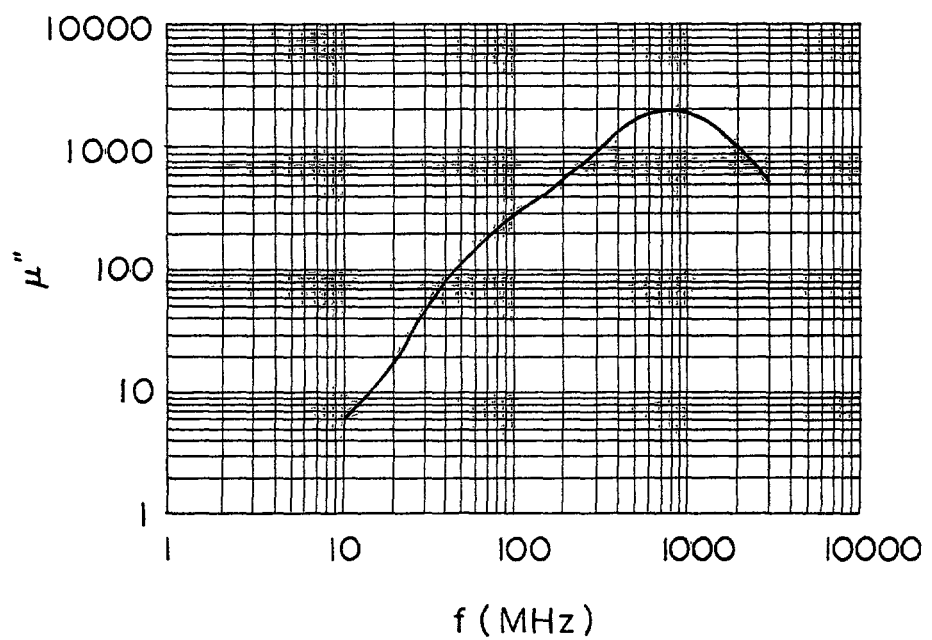
FIG. 8 is a graph of one example of the frequency dependency of the magnetic loss factor $\mu''$ relating to sample 1 as a magnetic loss film.

This sample 1 μ"-f response is plotted in FIG. 8. In FIG. 8, the frequency f (MHz) is plotted on the horizontal axis, and the magnetic loss factor μ" on the vertical axis. From FIG. 8, it will be seen that the magnetic loss factor μ" for sample 1 exhibits a dispersion with a very large and slightly sharp peak value, and that the resonance frequency is also high in the vicinity of 700 MHz.

Figure 9:
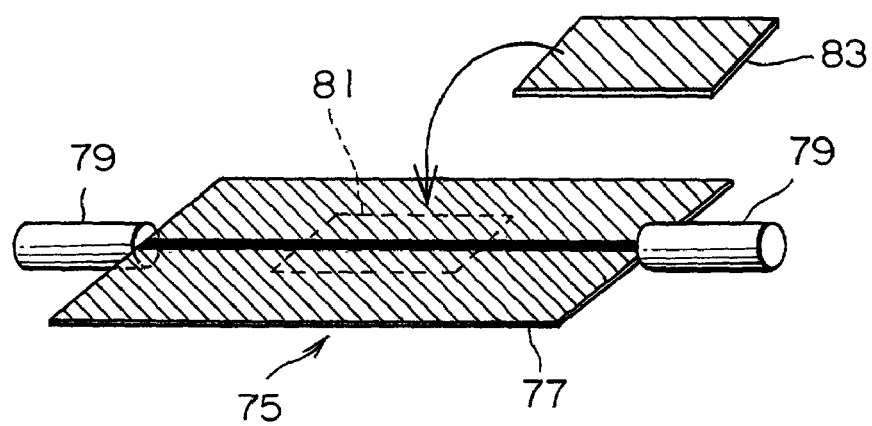
FIG. 9 is a perspective view of a measurement system for observing the suppression effect of a high-frequency current suppression body consisting of sample 1 as a magnetic loss film.

Tests were also conducted to verify the high-frequency electromagnetic interference suppression effect in the sample 1 using the high-frequency electromagnetic interference suppression effect measurement apparatus 65 diagrammed in FIG. 9. It should be noted that this high-frequency electromagnetic interference suppression effect measurement apparatus 65 is capable of measuring the transmission characteristic $S_{21}$ between two ports by first forming a coaxial line 32 for connecting a microstrip line 77 and a network analyzer (HP8753D, not shown) to either end, in the long dimension, of that microstrip line 77 having a line length of 75 mm and characteristic impedance Zc=50Ω, and then placing a magnetic body sample 33 directly above the place on the microstrip line 77 where a sample 31a is formed.

When the high-frequency current is controlled by adding an equivalent resistance component to the transmission line with a magnetic loss material formed in the immediate vicinity of the transmission line, as in the configuration of the high-frequency electromagnetic interference suppression effect measurement apparatus 65, it is believed that the high-frequency current suppression effect will be substantially proportional to the product of the magnetic loss factor μ" and the thickness δ of the magnetic body, that is, μ"·δ.

Figure 10:
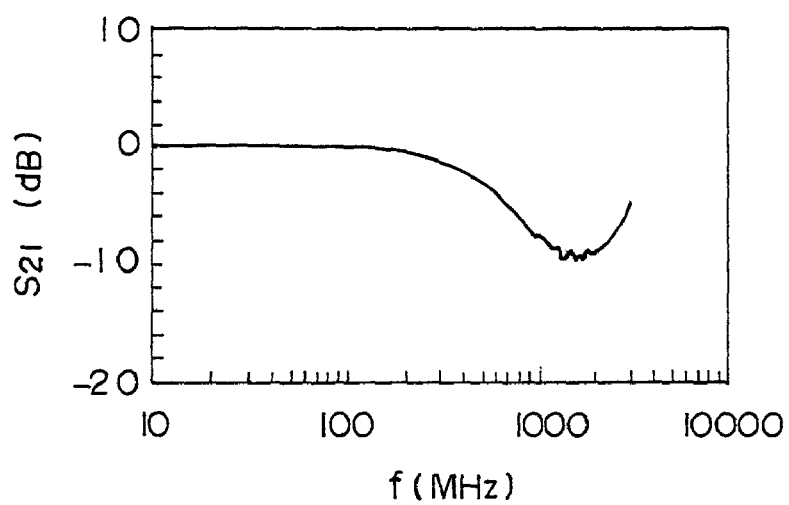
FIG. 10 is a plot of the frequency response of the transmission characteristic ($S_{21}$) of sample 1 as a magnetic loss film.

In FIG. 10 is plotted the transmission characteristic $S_{21}$ (dB) for the frequency f (MHz) indicated by the results of measuring the high-frequency current suppression effect of the sample magnetic body using the high-frequency electromagnetic interference suppression effect measurement apparatus 65.

From FIG. 10 it will be seen that the transmission characteristic $S_{21}$ of sample 1 decreases above 100 MHz and, after exhibiting a minimum value of −10 dB near 2 GHz, increases again. From these results it is seen that, while the transmission characteristic $S_{21}$ is dependent on the dispersion of the magnetic body magnetic loss factor μ", the suppression effect is dependent on the product μ"·δ noted above.

Now, a magnetic body, such as this sample 1, can be treated as being configured as a distribution constant line with permeability μ and dielectric constant ∈, the dimension being l. In such a case, there are a number of equivalent circuit constants per unit length (Δl), namely the unit inductance ΔL of the serially connected configuration and the unit resistance ΔR, together with the unit ground conductance ΔG and the unit electrostatic capacitance ΔC existing between those and the ground line. When these are converted to sample dimensions based on the transmission characteristic $S_{21}$, sample 1 can be treated as an equivalent circuit having, as equivalent circuit constants, inductance L and resistance R, together with electrostatic capacitance C and ground conductance G.

As in the examination of the high-frequency electromagnetic interference suppression effect here, in view of the fact that, in a case where formed on the magnetic body microstrip line 77, the variation in the transmission characteristic S21 results mainly from the resistance R component added in series to the inductance L in an equivalent circuit, the frequency dependency thereof can be investigated by finding the value of the resistance R.

Figure 11:
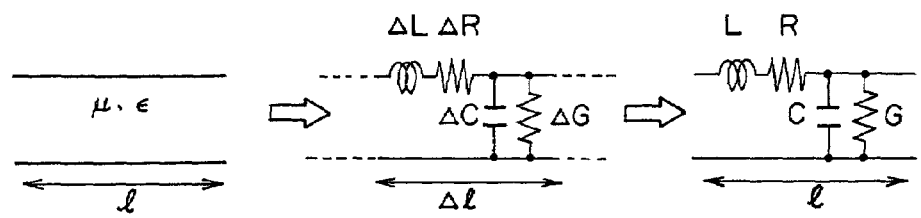
FIG. 11 is a diagram of an equivalent circuit for a magnetic body that is a magnetic loss film.
Figure 12:
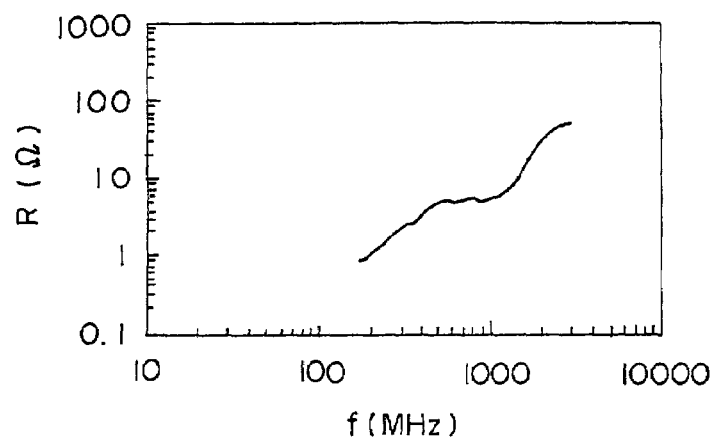
FIG. 12 is a plot of the frequency response of a resistance value R calculated from the transmission characteristic ($S_{21}$) of sample 1 as a magnetic loss film.

The values plotted in FIG. 12 were calculated on the basis of values of the resistance R added in series to the inductance L of the equivalent circuit diagrammed in FIG. 11. FIG. 12 represents the characteristics of the resistance value R (Ω) for the frequency f (MHz).

From FIG. 12, it is seen that the resistance value R increases simply in the sub-microwave band region, becoming several tens of Ω at 3 GHz, and that the frequency dependency thereof exhibits a trend differing from the frequency dispersion of the magnetic loss factor μ" that has a maximum near 1 GHz. This is believed to result from the fact being reflected that the ratio of the sample dimensions to the wavelength increases simply, in addition to the product μ"·δ as noted earlier.

Based on the results noted in the foregoing, it is safe to say that samples indicating a magnetic loss factor μ" dispersion in the sub-microwave band exhibit a high-frequency current suppression effect that is equivalent to a composite magnetic body sheet having substantially 500 times the thickness thereof, and that, for that reason, such are effective in high-frequency electromagnetic interference suppression measures at 1 GHz.

The present invention, however, is not limited to or by the embodiments described in the foregoing, and it goes without saying that various modifications are possible within such range as the main concept of the invention is not departed from. For example, in the embodiments of the present invention, only manufacturing examples using sputtering as the method of manufacturing the granular magnetic thin film are described, but that method may be another manufacturing method, such as vacuum vapor deposition, ion beam vapor deposition, or gas deposition, etc. There is no limit on the manufacturing method so long as therewith the magnetic loss film relating to the present invention can be uniformly realized.

In the embodiments of the present invention, furthermore, a heat treatment is implemented in a vacuum magnetic field after the film is formed, but, with an as-deposited film, so long as the composition and film formation method are such that the performance of the present invention is obtained, the treatment following film formation described in the embodiments poses no limitation.

In the embodiments described in the foregoing, moreover, descriptions are only provided for cases where the back side of the semiconductor bare chip 57, or semiconductor wafer 51, is directly coated with the magnetic loss film 55. However, provision may of course be made so that an adhesive tape having a magnetic loss film formed on the back surface thereof is applied to the back side of the semiconductor bare chip 57 or semiconductor wafer 51. In the embodiments described above, furthermore, cases are described where, for example, the magnetic loss film 55 is a granular magnetic thin film. That poses no limitation, however, and any film whatever may be used so long as it exhibits very large magnetic loss at high frequencies of from several tens of MHz to several GHz.

According to the first embodiment of the present invention, as described in the foregoing, the back side of a semiconductor bare chip or semiconductor wafer is covered with a magnetic loss film, wherefore it becomes possible to effectively reduce the spurious radiation generated from the integrated circuits formed on the front side thereof.

Next, a semiconductor substrate and manufacturing method according to another embodiment of the present invention are described, together with a semiconductor device wherein that semiconductor substrate is used.

Figure 13A:
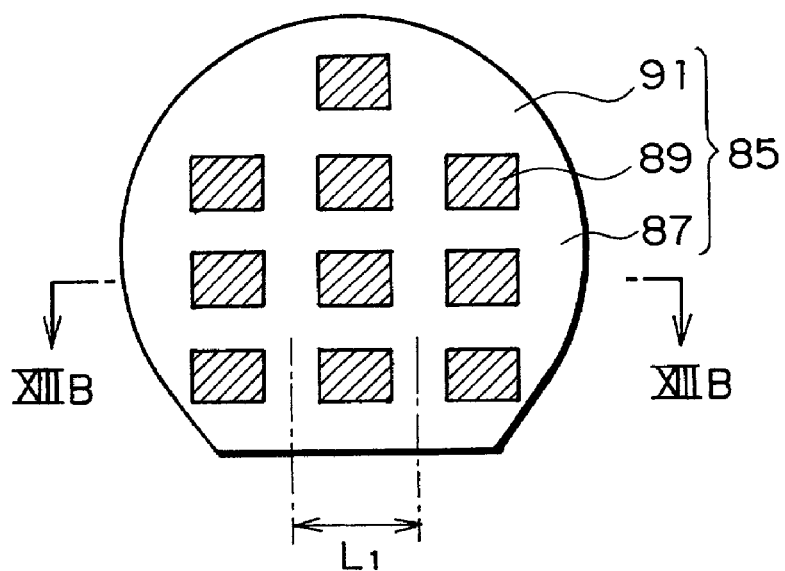
FIG. 13A is a plan of a semiconductor substrate relating to the first embodiment of the present invention.
Figure 13B:
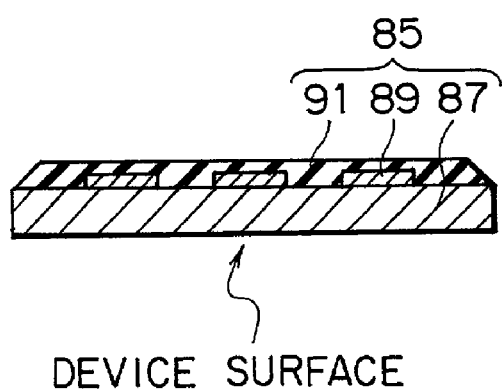
FIG. 13B is a section at the XIIIB—XIIIB line in FIG. 13A.

Referring to FIGS. 13A and 13B, a semiconductor substrate 85 according to a second embodiment of the present invention has a magnetic loss member 89 that is patterned in prescribed areas formed on a silicon substrate or silicon wafer 87, with the entirety thereof covered by an insulating film 91.

As diagrammed in FIG. 13B, moreover, in the semiconductor substrate 85 in this embodiment, the surface whereon the semiconductor device is formed is the surface on the opposite side from the surface whereon the magnetic loss member 89 is formed. In the silicon substrate 1, furthermore, prescribed impurity concentrations are established in accordance with the various semiconductor devices that will become the finally configured products.

The substance of the magnetic loss member 89 consists of M—X—Y, where M is either any one of, or a mixture of, Fe, Co, and Ni, X is either an element other than M and Y, or a mixture thereof, and Y is any one of, or a mixture of, F, N, and O. The composition of this magnetic loss member 89 is established as $Fe_{72}Al_{11}O_{17}$, for example. A magnetic loss member of such composition exhibits outstanding absorption characteristics, especially for electromagnetic waves in the MHz bands to those in the GHz bands, and effectively absorbs electromagnetic waves in the bands noted above that are generated from the various semiconductor devices formed on the silicon substrate 87.

Furthermore, because the magnetic loss member 89 having the composition noted is a blend that exhibits extremely high magnetic loss due to electromagnetic wave absorption, the thickness of the magnetic loss member 89 can be made significantly thinner. Thus the thickness of the magnetic loss member 89 can be made several tens of microns or less.

The electromagnetic wave absorption characteristics exhibited by the magnetic loss member 89 were investigated for a semiconductor device fabricated using the semiconductor substrate 85 of this embodiment. As a result, compared with the case of a semiconductor device using a conventional semiconductor substrate, such as the semiconductor substrate 39 diagrammed in FIGS. 2A and 2B, for example, wherein no measures against electromagnetic radiation were taken, an electromagnetic wave absorption effect of substantially 10 decibels (dB) or so was found to be produced by the magnetic loss member 2 at a frequency of approximately 3 GHz.

For the method of forming the magnetic loss member(s) 89 on the silicon substrate 87, first, for example, a magnetic loss member 89 layer is formed over the entire surface on the opposite side of the silicon substrate 87 from that whereon the semiconductor device noted above is formed, using sputtering or vapor deposition. Then the magnetic loss member 2 is formed, by lithography, in a prescribed pattern shape such as stripes, lattice, or islands. To form the magnetic loss member 89 layer on the silicon substrate 87, a film forming method other than the sputtering or vapor deposition methods mentioned above may be used, such, for example, as a chemical vapor phase growth (CVD) method or the like. The substance for the insulating film 91 is assumed to be silicon oxide, silicon nitride, or silicon nitride oxide. Each of the magnetic loss members 89 is formed in a region having an area that is narrower at least than that of each of the semiconductor device regions (the length of one side whereof is indicated by $L_1$ in FIG. 13A) individually divided from the semiconductor substrate 85.

Figure 14A:
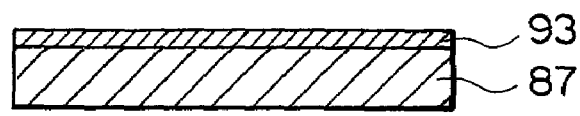
FIG. 14A is a diagram for describing a semiconductor substrate manufacturing method according to the first embodiment of the present invention, representing a condition wherein the magnetic loss member is formed over the entire surface of a silicon substrate.

The method of manufacturing the semiconductor substrate 85 in this second embodiment is now described. To manufacture the semiconductor substrate 101 in this second embodiment, first, as diagrammed in FIG. 14A, using a sputtering or vapor deposition method or the like, as noted earlier, a magnetic loss member layer 93 is formed over the entire surface on the opposite side from that of the silicon substrate 87 whereon the semiconductor device mentioned earlier is formed.

Figure 14B:
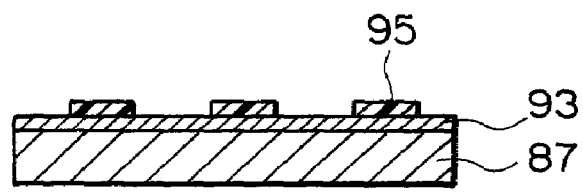
FIG. 14B is a diagram representing a condition wherein a resist pattern is formed at the magnetic loss member layer of the semiconductor substrate diagrammed in FIG. 14A.

Next, the magnetic loss members 89, in the prescribed patterns, are formed from that magnetic loss member layer 93, using the lithographic method noted earlier. More specifically, as diagrammed in FIG. 14B, a resist pattern 7 is formed on the magnetic loss member layer 93, then, a diagrammed in FIG. 14C, the magnetic loss members 89 are formed into the prescribed pattern shapes, whether striped, lattice-shaped, or island-shaped, etc., as noted earlier, leaving only those portions of the magnetic loss member layer 93 where the resist pattern 7 had been added as diagrammed in FIG. 14B.

Figure 14C:
FIG. 14C is a diagram representing a condition wherein a magnetic loss member 2 having a prescribed pattern has been formed, with only those portions where the resist pattern of the magnetic loss member layer added in the step diagrammed in FIG. 14B remaining.
Figure 14D:
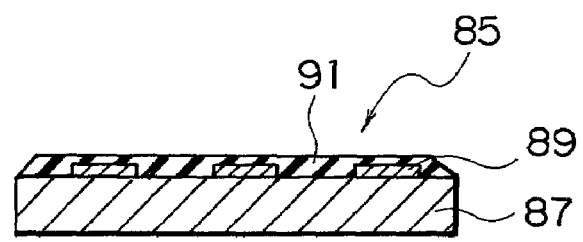
FIG. 14D is a diagram representing a condition wherein the surface on which the magnetic loss member 2 was formed in the step diagrammed in FIG. 14C is covered with an insulating film.

Thereupon, as diagrammed in FIG. 14D, the surface of the silicon substrate 87 whereon the magnetic loss members 89 have been formed as diagrammed in FIG. 14C is coated with the insulating film 91 consisting of silicon oxide, silicon nitride, or silicon nitride oxide, as noted earlier. Thus the semiconductor substrate 85 of this embodiment diagrammed in FIG. 14D is completed.

In each of the individual regions on the surface on the opposite side of this semiconductor substrate 85 from that whereon the magnetic loss members 89 are formed, the circuit pattern for each of the semiconductor devices is formed, and the semiconductor devices are fabricated by cutting out those individual regions. Moreover, when the magnetic loss members 89 are formed in shapes such as stripes, lattice, or islands, as described earlier, it is assumed that each of the semiconductor devices comprises at least one of the unit regions wherein a magnetic loss member 89 is formed.

According to this second embodiment, an anti-noise measure is implemented at what could be called the stage of the substrate itself, wherefore technology can be provided that excels in terms of the volume production of noise-suppressed semiconductor devices. More specifically, when semiconductor devices are manufactured using this semiconductor substrate 85, if noise is generated from the semiconductor device, that noise does not leak out as is to the outside, but is absorbed by the magnetic loss member 89 formed on the back surface of the semiconductor device. As a result, erroneous operations are not induced in other devices or equipment. Compared to the conventional examples wherein anti-noise measures are implemented by applying noise absorbing members, in a post-process, to the back surface of each individual semiconductor device, one at a time, [the method of this embodiment] does not require a lot of time for the process for implementing the anti-noise measure. Also, in view of the fact that the magnetic loss members 89 are formed in the same process step on the back surfaces of the individual semiconductor device formation regions on the semiconductor substrate 85, variations in the thickness of the magnetic loss members 89 do not readily arise and, accordingly, variation can be prevented from arising in the noise absorption characteristics of the individual semiconductor devices.

Figure 15A:
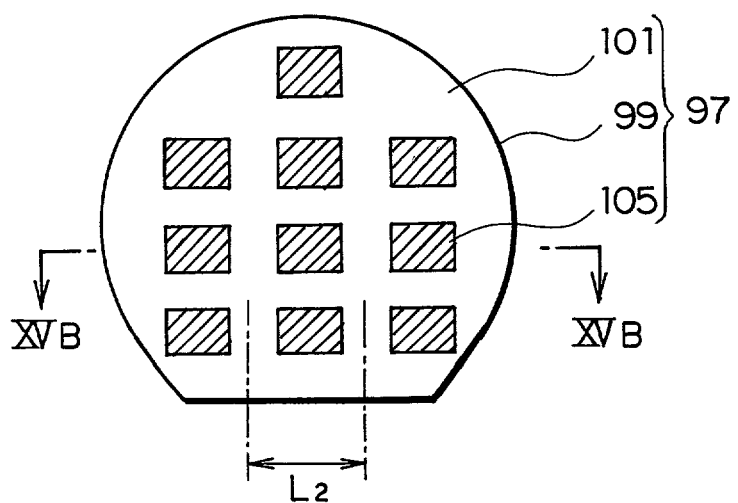
FIG. 15A is a plan of a semiconductor substrate relating to a second embodiment of the present invention.
Figure 15B:
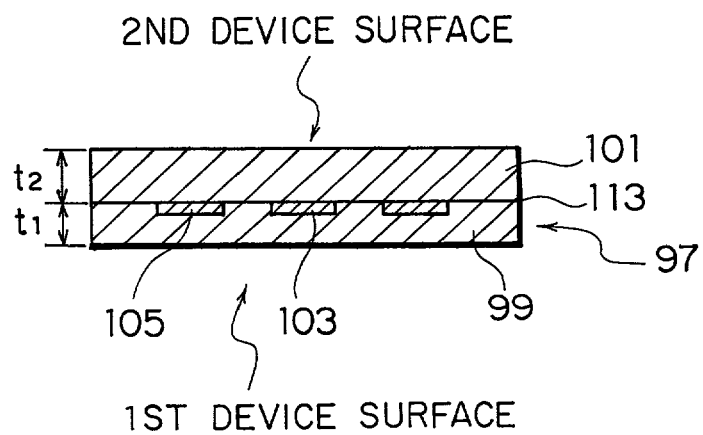
FIG. 15B is a section at the XVB—XVB line in FIG. 15A.

With reference to FIGS. 15A and 15B, a semiconductor substrate 97 relating to a third embodiment of the present invention has a first silicon substrate 99 and a second silicon substrate 101 joined together, either by joining the two silicon substrates together, or joining them by electrostatic bonding. Here, trenches 103 are formed in a prescribed pattern in the first silicon substrate 99, while magnetic loss members 103 are formed embedded in the interior of the trenches 103.

Here, as diagrammed in FIG. 15B, the surface of the semiconductor substrate 97, whereon the semiconductor devices are formed, may be either the first, semiconductor device formation, surface corresponding to the first silicon substrate 99, or the second, semiconductor device formation, surface corresponding to the second silicon substrate 101. In either the silicon substrate 99 or 101, previously prescribed impurity concentrations are established in accordance with the semiconductor device to be finally fabricated.

The substance of the magnetic loss member 105 consists of M-X—Y, where M is either any one of, or a mixture of, Fe, Co, and Ni, X is either an element other than M and Y, or a mixture thereof, and Y is any one of, or a mixture of, F, N, and O. The composition of this magnetic loss member 105 is established as $Fe_{72}Al_{11}O_{17}$, for example. A magnetic loss member of such composition exhibits outstanding absorption characteristics, especially for electromagnetic waves in the MHz bands to those in the GHz bands, and effectively absorbs electromagnetic waves in the bands noted above that are generated from the various semiconductor devices formed on the first silicon substrate 99 or the second silicon substrate 101. Furthermore, because the magnetic loss member 105 having the composition noted is a blend that exhibits extremely high magnetic loss due to electromagnetic wave absorption, the thickness of the magnetic loss members 105 can be made significantly thinner, that is, several tens of microns or less. Each of the trenches 103 is formed in a region having an area that is narrower at least than that of each of the semiconductor device regions, herein, the length of one side whereof is indicated by $L_2$ in FIG. 15A, individually divided from the semiconductor substrate 97. Furthermore, the thickness $t_1$ of the first silicon substrate 99 and the thickness $t_2$ of the second silicon substrate 101 indicated in FIG. 15B may be suitably established so that the following two conditions are satisfied. The first condition is that a semiconductor substrate be obtained wherein the desired thickness is realized with $t_1+t_2$. The second condition is that $t_1$, $t_2$, and the depth of the trenches 103 be established so that the magnetic loss members 105 are formed at positions which are optimal according to the noise resistance properties of and amount of noise generated by the semiconductor devices formed respectively on the first silicon substrate 99 and the second silicon substrate 101.

The method of manufacturing the semiconductor substrate 97 in this third embodiment is now described.

Figure 16A:
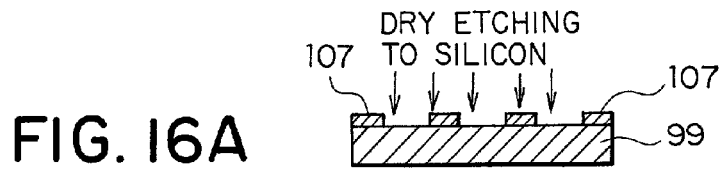
FIG. 16A is a diagram for describing a manufacturing method for a semiconductor substrate according to the second embodiment of the present invention, representing a condition wherein a silicon oxide pattern is formed on a first silicon substrate, and the exposed portions of the silicon are dry-etched.
Figure 16B:
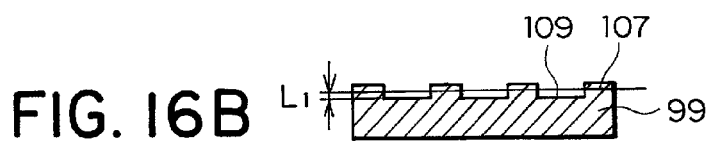
FIG. 16B is a diagram representing a condition wherein trenches 41 of a prescribed depth L1 are formed in the semiconductor substrate of FIG. 16A.

First, as diagrammed in FIG. 16A, after forming the silicon oxide 107 pattern on the first silicon substrate 99, that first silicon substrate 99 is dry-etched. As a result, the exposed portions of the silicon other than the silicon oxide 107 pattern portions in the first silicon substrate 99 are etched away, and the pattern of trenches 109 are formed, to a prescribed depth, as diagrammed in FIG. 16B.

Figure 16C:
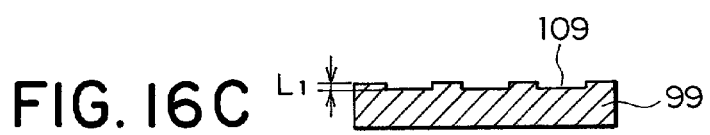
FIG. 16C is a diagram representing a condition wherein, from the condition diagrammed in FIG. 16B, the silicon oxide has been removed and the surface of the silicon substrate having the trenches has been exposed.

Then, as diagrammed in FIG. 16C, the silicon oxide 107 is removed to expose the silicon substrate surface having the trenches 109.

Figure 16D:
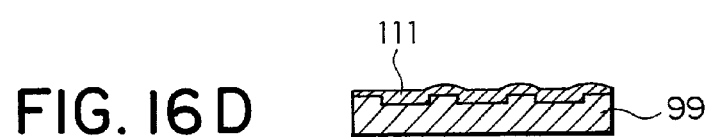
FIG. 16D is a diagram representing a condition wherein a magnetic loss member layer has been formed on the entire surface on one side of the substrate diagrammed in FIG. 16C.
Figure 16E:
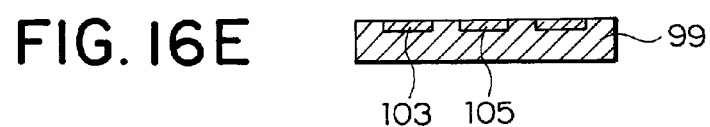
FIG. 16E is a diagram representing a condition wherein one side has been subjected to a polishing process, and the silicon substrate surface and the magnetic loss members inside the trenches have been exposed.

Next, as diagrammed in FIG. 16D, a magnetic loss member layer 111 is formed over the entire surface on the side of the first silicon substrate 99 containing the trenches 109 exposed [in the step diagrammed] in FIG. 16E. For the method of forming this magnetic loss member layer 111, a film forming method such as sputtering, vapor deposition, or chemical vapor growth (CVD) is used, as in the first embodiment described earlier.

Then, as diagrammed in FIG. 16E, the surface of the first silicon substrate 99 on the side where the magnetic loss member layer 11 was formed in the step diagrammed in FIG. 16D is subjected to a polishing treatment, to obtain a condition wherein the silicon substrate surface and the portions of the magnetic loss member layer 111 embedded inside the trenches 109 are exposed. As a result, as diagrammed in FIG. 16E, the magnetic loss members 105 are formed according to the pattern of the trenches 109 on the first silicon substrate 99.

Figure 16F:
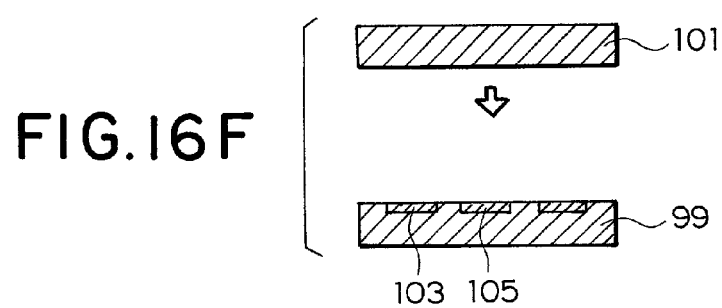
FIG. 16F is a diagram representing a condition wherein a second silicon substrate has been prepared, immediately prior to joining it to the first silicon substrate.
Figure 16G:
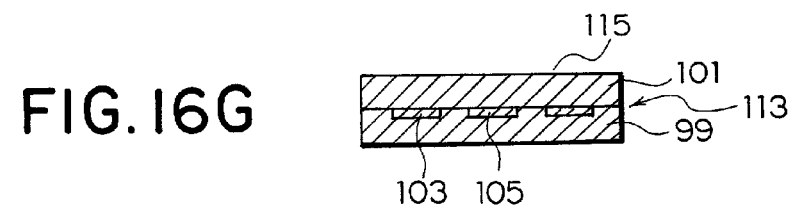
FIG. 16G is a diagram representing a condition wherein the first silicon substrate and the second silicon substrate have been joined.

Further, as diagrammed in FIG. 16F, the second silicon substrate 101 described above is prepared, and joined to the surface side of the first silicon substrate 99 that was polished in the step diagrammed in FIG. 16E, as diagrammed in FIG. 16G. In the step diagrammed in FIG. 16F, moreover, the entire surface of the side of the second silicon substrate 111 that is in opposition to the first silicon substrate 99 is thermally oxidized in advance. Then the thermally oxidized opposing side of the second silicon substrate 101 is joined to the first silicon substrate 99 by electrostatic bonding. Thus the semiconductor substrate 97 diagrammed in FIG. 16G, wherein the first silicon substrate 99 and the second silicon substrate 101 are joined together, is fabricated. In FIG. 16G, the symbol 113 indicates the joining interface. The semiconductor substrate 97 diagrammed in FIG. 16G is the finished condition of the semiconductor substrate of this embodiment.

Because the pattern of the trenches 109 is determined according to the pattern forming the silicon oxide 107 diagrammed in FIG. 16A, a silicon oxide 107 pattern may be formed so that the pattern of the magnetic loss members 105 embedded inside those trenches 109 becomes a prescribed pattern, whether forming stripes, a lattice, or islands, etc. In this third embodiment, moreover, the second silicon substrate 101 is joined to the surface of the first silicon substrate 99 on the side where the magnetic loss members 105 are embedded, wherefore, unlike in the first embodiment described earlier, it is not necessary to coat the surface on which the magnetic loss members 105 are formed with an insulating film such as silicon oxide or the like.

Now, in the semiconductor substrate 115 of this embodiment, as described above, semiconductor devices can be formed in either the first, semiconductor device formation, surface corresponding to the first silicon substrate 99, or the second, semiconductor device formation, surface corresponding to the second silicon substrate 101. The semiconductor device circuit patterns are formed in each of the individual regions in these first or second surfaces. The semiconductor devices are also fabricated by cutting out those individual regions. As described earlier, furthermore, when the magnetic loss members 21 are formed in a striped, lattice, or island shape or the like, each of the semiconductor devices is to comprise at least one of the unit regions wherein a magnetic loss member 21 is formed.

According to this embodiment also, an anti-noise measure is implemented at the stage of the substrate itself, wherefore technology can be provided that excels in terms of the volume production of noise-suppressed semiconductor devices. More specifically, in manufacturing semiconductor devices by the use of this semiconductor substrate 97, if noise is generated from the semiconductor device, the noise does not leak out unhindered to the outside, but is absorbed by the magnetic loss member 105 embedded inside the semiconductor device. As a result, erroneous operations are not induced in other devices or equipment. Compared to the conventional examples wherein anti-noise measures are implemented by applying noise absorbing members, in a post-process, to the back surface of each individual semiconductor device, one at a time, the method of this embodiment does not require a lot of time for the process for implementing the anti-noise measure. Also, because the magnetic loss members 105 can be formed in the same process step at internal locations corresponding to the individual semiconductor device formation regions in the semiconductor substrate 97, variations in the thickness of the magnetic loss members 105 do not readily arise and, accordingly, variation can be prevented from arising in the noise absorption characteristics of the individual semiconductor devices.

Figure 17A:
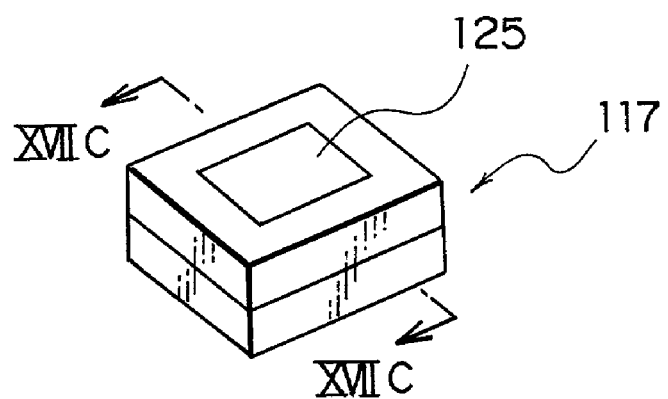
FIG. 17A is an external perspective view of a semiconductor device relating to a third embodiment of the present invention.
Figure 17B:
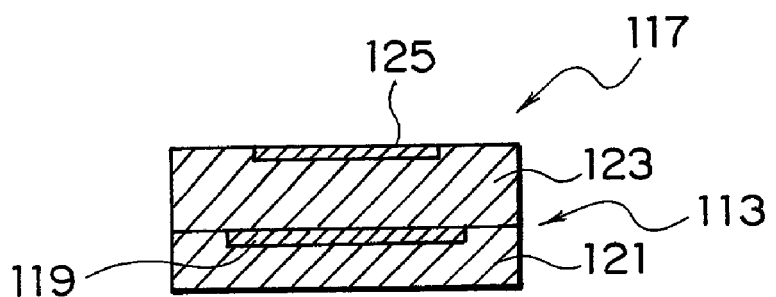
FIG. 17B is a section at the XVIIB—XVIIB line in FIG. 17A.

Referring to FIGS. 17A and 17B, a semiconductor device 117 relating to a fourth embodiment of the present invention is fabricated using the semiconductor substrate according to the third embodiment described in the foregoing. This semiconductor device 117 is formed with a first silicon substrate 121 wherein a magnetic loss member 119 is embedded joined to a second silicon substrate 123, with a circuit pattern region 125 formed in the vicinity of the back surface of the second silicon substrate 123.

With the semiconductor device 117 of this fourth embodiment, due to the structure thereof, electromagnetic noise generated from the vicinity of the circuit pattern region 125 is absorbed efficiently by the magnetic loss member 119. When the electromagnetic wave absorption characteristics were investigated which were produced by the semiconductor device 117 of this embodiment, the electromagnetic wave absorption effect was found to be approximately 10 decibels or so when compared to the conventional semiconductor device diagrammed in FIG. 4 wherein no anti-noise measures had been implemented. Also, when the electromagnetic wave absorption characteristics produced by the semiconductor device 117 of this embodiment were compared to the conventional semiconductor device diagrammed in FIG. 5, wherein no anti-noise measures had been implemented, at a frequency of approximately 3 GHz, an electromagnetic wave absorption effect of approximately 7 decibels or so was obtained.

Various embodiments of the present invention are described in the foregoing, but the present invention is not limited to or by those embodiments, and it goes without saying that other embodiments can be employed, within the scope of the inventions described in the claims.

In the second to fourth embodiment described in the foregoing, for example, the substance of the semiconductor substrate is made silicon, but similar effects are obtained with substances other than silicon, such, for example, as a gallium-arsenic material or silicon-germanium material.

Based on the second and third embodiments of the present invention, semiconductor substrates can be provided that can efficiently absorb interfering electromagnetic waves from the MHz bands to the GHz bands, that are capable of exhibiting noise absorption effects when divided into individual devices, and that exhibit outstanding volume productivity in the fabrication of devices, together with a manufacturing method therefor, and a semiconductor device is also provided wherein those semiconductor substrates are used.

A fifth embodiment of the present invention is next described.

To begin with, a specific example of a manufacturing method for an electrically conductive magnetic thin film having a granular structure comprising an M-X—Y composition, where M is either any one of, or a mixture of, Fe, Co, and Ni, X is either an element other than M and Y, or a mixture thereof, and Y is any one of, or a mixture of, F, N, and O, that can be used in the present invention will be described.

A granular magnetic thin film used in verifying the present invention was fabricated on a glass substrate by sputtering under the conditions noted in Table 1. The sputtered film so obtained was subjected to heat treatment at 300° C. for 2 hours in a vacuum magnetic field to yield an electromagnetic noise evaluation sample.

When that sample was subjected to fluoroscopic x-ray analysis, the composition of the film was found to be $Fe_{70}Al_{12}O_{18}$.

The DC resistance of this sample was 330 μΩ·cm, Hk was 21 Oe (1.66 kA/m), and Ms was 14300 Gauss (1.43 T). The film thickness in this sample was found to be 2 μm by observing the cross-section thereof with an SEM.

TABLE 1

| Sputtering Conditions | |
|---|---|
| Vacuum degree before deposition | < 1 × 10$^{-6}$ Torr |
| Atmosphere upon deposition | Ar |
| Power Supply | RF |
| Target | Fe (Diameter φ: 100 mm) + Al$_2$O$_3$ chip (135 pieces) (Chip size: 5 mm × 5 mm × 2 mm$^t$) |

The μ-f response was investigated to verify the magnetic loss characteristics of the sample. The μ-f response was measured by inserting [the sample] in a detection coil fashioned in a ribbon shape, and measuring the impedance while applying a bias magnetic field, thus obtaining the frequency response of the magnetic loss factor μ".

Figure 18:
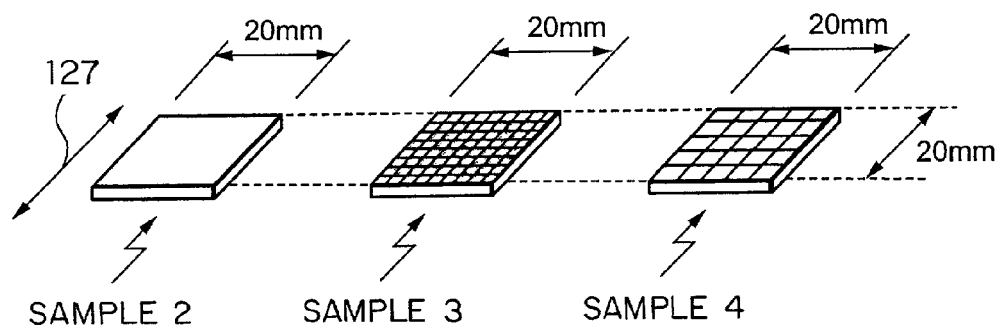
FIG. 18 is a diagram provided for describing samples used in evaluating electromagnetic noise according to an embodiment of the present invention.

The magnetic loss factor μ" exhibited a maximum value of 945 at a frequency of 930 MHz. From this sample three square samples measuring 20 mm on a side were cut. One of those three was made sample 2, while the other two were finely divided in 0.8 mm square and 3.8 mm square configuring units, respectively (at a pitch of 1 mm and 4 mm, respectively), yielding sample 3 and sample 4, respectively, structured such that the conduction of DC currents between the configuring units was interrupted, as diagrammed in FIG. 18. Here, in FIG. 18, the double-headed arrow 127 indicates the axial direction highly resistant to magnetization. The aspect ratios of samples 2, 3, and 4 were 5000, 400, and 1000, respectively, and shape anisotropy was maintained such that the reverse magnetic field coefficient can be deemed to be virtually zero even in the finely divided configuring elements.

Figure 19:
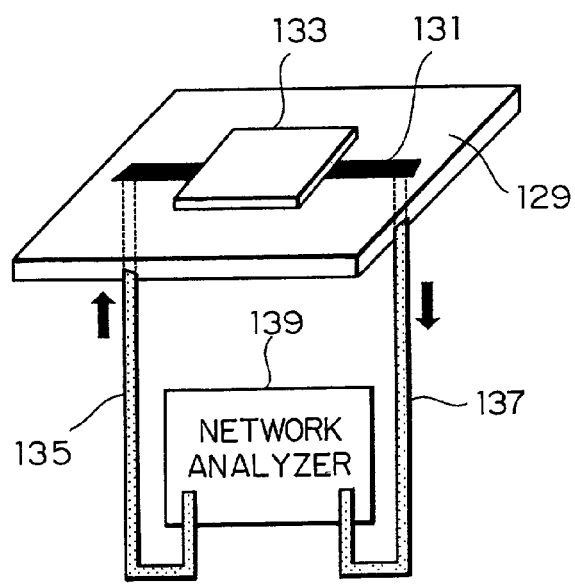
FIG. 19 is a diagram of an electromagnetic noise evaluation system.

The electromagnetic noise suppression effects of samples 2, 3, and 4 so obtained were investigated using the conductive magnetic noise evaluation system diagrammed in FIG. 19. In FIG. 19, the magnetic noise evaluation system is configured such that a sample indicated by the symbol 133 is placed on the microstrip line 131 of a dielectric substrate 129, and measurements and evaluations are made with a network analyzer 139 connected to either end of the microstrip line 131 by coaxial cables 135 and 137.

Here, all of the samples were formed so that the axes of magnetiz-ation resistance were at right angles to the long dimension of the microstrip line 131 of the dielectric substrate 129 of the evaluation system. For comparative samples for verifying the stub effect, a square copper foil (with a glass plate substrate) measuring 20 mm on a side and having a thickness of 18 μm was prepared, together with a mesh-form copper foil, made by finely dividing the first mentioned copper foil into 0.8 mm square configuring units, configured so that the conduction of DC currents between the configuring units was interrupted. These were subjected to measurement along with the samples of the present invention as comparative sample 1 and comparative sample 2. The electromagnetic noise suppression effects are plotted in FIGS. 20 and 21.

Figure 20:
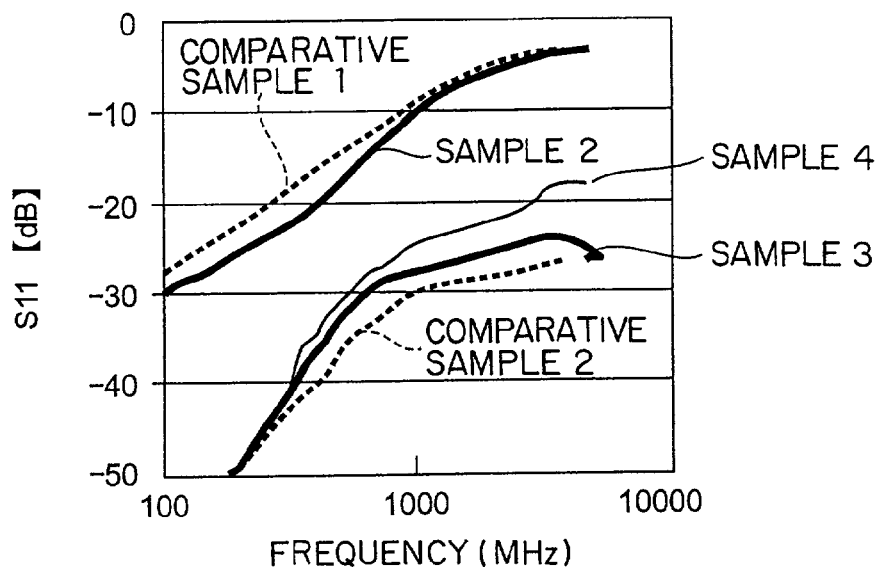
FIG. 20 is a graph showing the electromagnetic noise suppression effect of samples of electromagnetic noise suppression bodies according to an embodiment of the present invention, plotting values for the reflection characteristic (S11)
Figure 21:
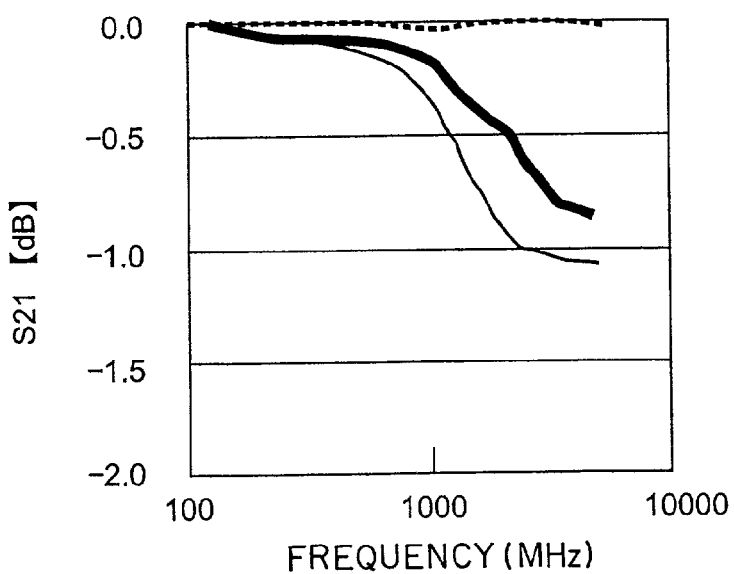
FIG. 21 is a graph showing the electromagnetic noise suppression effect of samples of electromagnetic noise suppression bodies according to an embodiment of the present invention, plotting the reflection characteristic (S21)

Here, the reflection characteristic (S11) produced by forming the samples in the evaluation system is represented in FIG. 20, while the transmission characteristic (S21) is represented similarly in FIG. 21. Referring to FIG. 3, for both sample 2 of the present invention and comparative sample 1, the reflection characteristic (S11) was −10 dB or greater in the GHz band region, and it will be seen that reflection was produced by forming the samples directly above the transmission line. For sample 3 or sample 4 of the present invention and comparative sample 2, which were finely divided into 0.8 mm square or 3.8 mm square configuring units and given structures such that the conduction of DC currents between the configuring units was interrupted, reflection characteristics of approximately −20 dB or lower were exhibited, even in the GHz band region, which can be viewed as non-reflecting, and it is seen that the stub effect can be suppressed by finely dividing an electrically conductive soft magnetic thin film into sizes sufficiently smaller than the wavelength of the electro-magnetic noise and electrically insulating each of those finely divided units.

Referring to FIG. 21, no attenuation is observed with the non-magnetic comparative sample 4 that is finely divided into configuring units sufficiently small relative to the wavelength, but in sample 3 or sample 4 of the present invention which are finely divided soft magnetic body samples, transmittance loss is observed in the GHz band that is thought to be due to magnetic loss, and it can be understood that non-reflecting electromagnetic noise suppression effects are exhibited which are the effect of the present invention.

Based on the fifth embodiment of the present invention, as described in the foregoing, electromagnetic noise suppression bodies effective in suppressing electromagnetic noise in semiconductor devices and electronic circuits that operate at high speeds can be provided.

Based on the fifth embodiment of the present invention, moreover, electromagnetic noise suppression bodies capable of effectively suppressing electromagnetic noise with a smaller volume can be provided.

In the fifth embodiment of the present invention, furthermore, the soft magnetic thin film having the granular structure has an extremely thin thickness of 2 μm, and it becomes possible to control conductive electromagnetic noise without reflection in minute areas such as inside semiconductor integrated devices by using the present invention, whereupon the industrial value thereof can be said to be extremely high.

Last of all, a sixth embodiment of the present invention is described.

To begin with, one example of a manufacturing method for an electrically conductive magnetic thin film having a granular structure comprising an M-X—Y composition, where M is either any one of, or a mixture of, Fe, Co, and Ni, X is either an element other than M and Y, or a mixture thereof, and Y is any one of, or a mixture of, F, N, and O, that can be used in the present invention will be described.

A granular magnetic thin film used in verifying the present invention was fabricated on a glass substrate by sputtering under the conditions noted in Table 2 below. The sputtered film so obtained was subjected to heat treatment at 300° C. for 2 hours in a vacuum magnetic field to yield an electromagnetic noise evaluation sample.

When that sample was subjected to fluoroscopic x-ray analysis, the composition of the film was found to be $Fe_{70}Al_{12}O_{18}$.

The DC resistance of this sample was 330 μΩ·cm, Hk was 21 Oe (1.66 kA/m), and Ms was 14300 Gauss (1.43 T). The film thickness in this sample was found to be 2 μm by observing the cross-section thereof with an SEM. The μ-f response was investigated to verify the magnetic loss characteristics of the sample.

Figure 22:
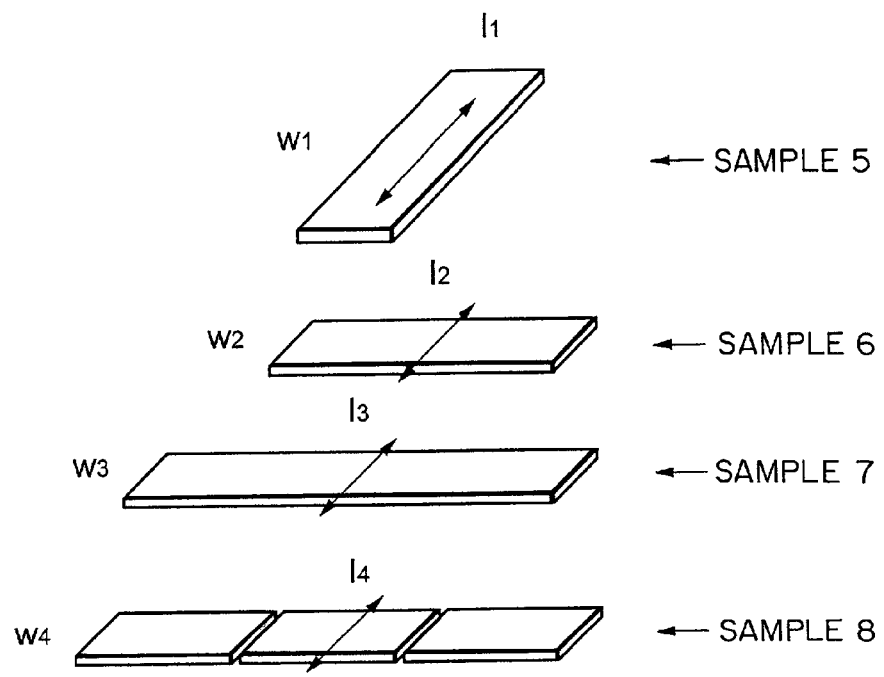
FIG. 22 is a diagram provided for describing samples of an electromagnetic noise suppression body according to an embodiment of the present invention.

The μ-f response was measured by inserting the sample into a detection coil fashioned in a ribbon shape, and measuring the impedance while applying a bias magnetic field, thus obtaining the frequency response of the magnetic loss factor μ". The magnetic loss factor μ" exhibited a maximum value of 945 at a frequency of 930 MHz. From this sample four rectangular samples of different shape but identical surface area were cut, as indicated in Table 3 below, and designated samples 5 to 8, as diagrammed in FIG. 22. The double-headed arrows in FIG. 22 indicate the magnetization resistant axial direction in each sample.

Figure 23:
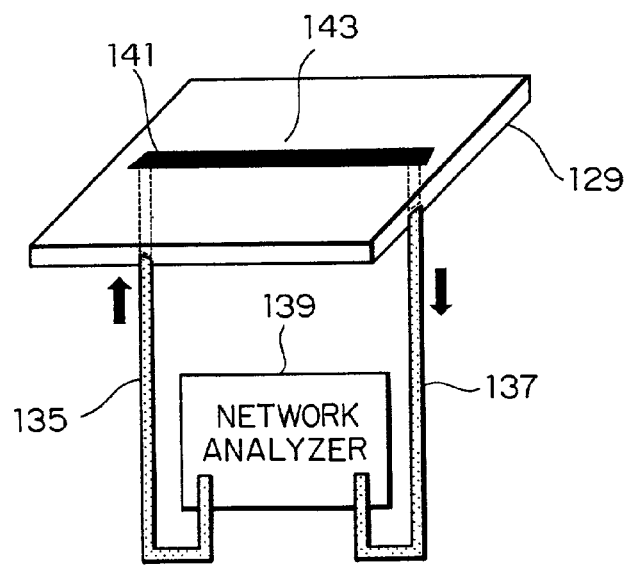
FIG. 23 is a schematic structural diagram of a conductive electromagnetic noise evaluation system for electromagnetic noise suppression bodies according to an embodiment of the present invention.

The electromagnetic noise suppression effects of the verification samples 5 to 8 so obtained were investigated using the conductive electromagnetic noise evaluation system diagrammed in FIG. 23. Referring to FIG. 23, in this conductive electromagnetic noise evaluation system, the two ends of a microstrip line 141 formed on a dielectric substrate 129 the entire back surface whereof is a conductor are connected to a network analyzer 139 via coaxial cables 135 and 137, and the samples are placed in the portion indicated by the symbol 143 over the microstrip line 141. The line width of the microstrip line 141 used in this evaluation system is 3 mm, and sample 5 exhibits a width that is sufficiently wide relative to the microstrip line 141. Sample 6, on the other hand, has a width that is substantially the same as the width of the microstrip line 141, while sample 7 has a width that is narrower than the width of the microstrip line 141.

The verification sample 8 consists of three small pieces of a width narrower than the width of the microstrip line 141. With the exception of sample 5, each sample was formed so as to protrude from the microstrip line 141, and all of the samples from 5 to 8 were formed so that the magnetization resistant axis of the sample is at right angles to the length dimension of the microstrip line. The aspect ratios of the samples in the width dimension of the microstrip line 141 are 10 or greater in every case. For comparative samples for verifying the stub effect, copper foils, with glass plate substrates, of the same shapes as sample 5 and sample 6, respectively, and widths of 18 μm, were prepared, designated comparative sample 3 and comparative sample 4, and subjected to measurement together with the samples of the present invention. The results of the electromagnetic noise suppression effect measurements are plotted in FIGS. 24 and 25. Here, FIG. 24 represents the reflection characteristic (S11) produced by forming the samples in the evaluation system, while FIG. 25 represents the transmission characteristic (S21) similarly.

Figure 24:
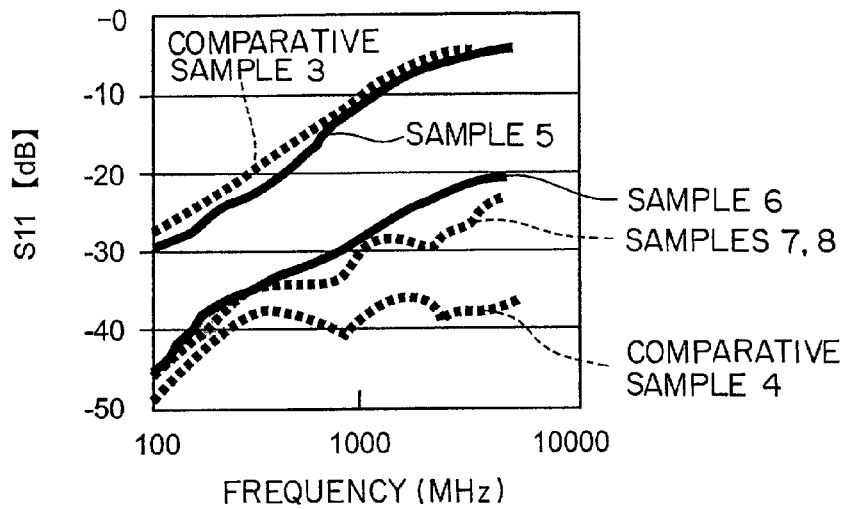
FIG. 24 is a graph plotting the electromagnetic noise suppression effects of samples of electromagnetic noise suppression bodies according to an embodiment of the present invention, plotting the reflection characteristic (S11)

Referring to FIG. 24, for both sample 6 of the present invention and comparative sample 3, the reflection characteristic (S11) was −10 dB or greater in the GHz band region, and it is seen that reflection occurs when the samples are placed immediately above the microstrip line 141.

Samples 6, 7, and 8 of the present invention and the non-magnetic comparative sample 4 have equal or narrower widths than the width of the microstrip line 141 and exhibit a reflection characteristic of −20 dB or lower, which can be deemed non-reflecting, even in the GHz band region. In this event, it is seen that the stub effect caused by the electrical conductivity of a soft magnetic thin film can be suppressed by making the width of that soft magnetic thin film either equivalent to or narrower than that of the microstrip line.

Figure 25:
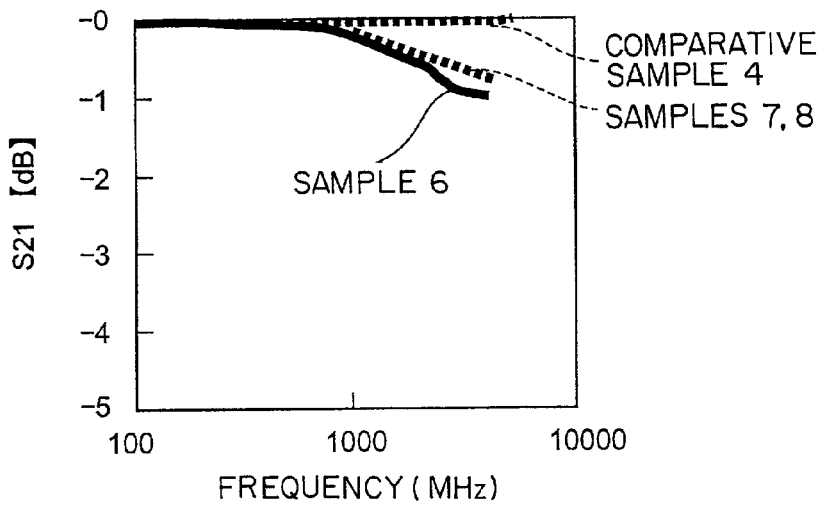
FIG. 25 is a graph plotting the electromagnetic noise suppression effects of samples of electromagnetic noise suppression bodies according to an embodiment of the present invention, plotting the reflection characteristic (S21).

Referring to FIG. 25, although no attenuation is seen with the non-magnetic comparative sample 4, transmittance loss is observed in the GHz band, thought to be due to magnetic loss, in samples 5 and 7 having widths equivalent to or narrower than the width of the microstrip line, sample 8 consisting of three small pieces of narrower width than the microstrip line, and the non-magnetic comparative sample 4. Thus it can be understood that a non-reflecting electromagnetic noise suppression effect that is the effect of the present invention is exhibited.

TABLE 2

Sputtering Conditions

| | |
|---|---|
| Vacuum degree before deposition | < 1 × $10^{-6}$ Torr |
| Atmosphere upon deposition | Ar |
| Power Supply | RF |
| Target | Fe (Diameter φ: 100 mm) + $Al_2O_3$ chip (135 pieces) (Chip size: 5 mm × 5 mm × 2 $mm^t$) |

TABLE 3

| | | Width (mm) | Length (mm) |
|---|---|---|---|
| Present Invention | Sample 5 | 20 | 3 |
| | Sample 6 | 3 | 20 |
| | Sample 7 | 2 | 30 |
| | Sample 8 | 2 | 10 × 3 |
| Comparative Examples | Comparative Sample 3 | 20 | 3 |
| | Comparative Sample 4 | 3 | 20 |

As described in the foregoing, while the outflow of electromagnetic noise is effectively suppressed by the deployment of a granular magnetic body, occasions arise where the electromagnetic noise component is partially reflected so that it returns to the signal source, wherefore there have been cases when secondary interference is generated at the signal source. However, the soft magnetic thin film having a granular structure used in the present invention has an extremely thin thickness of 2 μm, and when this is used in the present invention, it becomes possible to suppress conductive electromagnetic noise without reflection, even in minute areas such as inside semiconductor integrated devices, whereupon the industrial value of the present invention can be said to be extremely high.

What is claimed is:

1. A semiconductor bare chip having an integrated circuit formed on front surface thereof and a magnetic loss film formed on the back surface of said semiconductor bare chip, wherein said magnetic loss film is a granular magnetic thin film and is composed of M-X—Y, where M is at least one of Fe, Co, and Ni, X is at least one element other than M and Y, and Y is at least one of F, N, and O, and said M component is present in an amount effective for said film to exhibit a saturation magnetization of 35 to 80% relative to the saturation magnetization of a bulk metal body consisting exclusively of the M component.

2. The semiconductor bare chip according to claim 1, wherein said granular magnetic thin film is a sputtered film formed by a sputtering method.

3. The semiconductor bare chip according to claim 1, wherein said granular magnetic thin film is a vapor-deposited film formed by a vapor deposition method.

4. A semiconductor wafer having an integrated circuit formed on front surface thereof, and wherein a magnetic loss film is formed on the back surface of said semiconductor wafer, and wherein said magnetic loss film is a granular magnetic thin film and is composed of M-X—Y, where M is at least one of Fe, Co, and Ni, X is at least one element other than M and Y, and Y is at least one of F, N, and O, and said M component is present in an amount effective for said film to exhibit a saturation magnetization of 35 to 80% relative to the saturation magnetization of a bulk metal body consisting exclusively of the M component.

5. The semiconductor wafer according to claim 4, wherein said granular magnetic thin film is a sputtered film formed by a sputtering method.

6. The semiconductor wafer according to claim 4, wherein said granular magnetic thin film is a vapor-deposited film formed by a vapor deposition method.

7. A semiconductor substrate having a semiconductor wafer and a magnetic loss member formed in a part thereof on the semiconductor wafer, wherein said magnetic loss member is formed in a prescribed pattern on the back surface of said semiconductor substrate, the front surface side of the semiconductor substrate having an integrated circuit thereon, said magnetic loss member and semiconductor substrate region on said surface are uniformly covered with an insulating film, and said magnetic loss member has a granular structure and is composed of M-X—Y, where M is either any one of, or a mixture of, Fe, Co, and Ni, X is either an element other than M and Y, or a mixture thereof, Y is any one of, or a mixture of, F, N, and O, and said M component is present in an amount effective for said film to exhibit a saturation magnetization of 35 to 80% relative to the saturation magnetization of a bulk metal body consisting exclusively of the M component.

8. The semiconductor substrate according to claim 7, wherein said prescribed pattern is formed by said magnetic loss member and is a striped pattern.

9. The semiconductor substrate according to claim 7, wherein said prescribed pattern is formed by said magnetic loss member and is a lattice pattern.

10. The semiconductor substrate according to claim 7, wherein said prescribed pattern is formed by said magnetic loss member and is an island pattern.

11. The semiconductor substrate according to claim 7, wherein said insulating film comprises at least one material selected from a group consisting of silicon oxide, silicon nitride, and silicon nitride oxide.

12. The semiconductor substrate according to claim 7 wherein the semiconductor wafer consists of silicon.

13. The semiconductor substrate according to claim 7, wherein the semiconductor wafer consists of GaAs.

14. A semiconductor substrate according to claim 7, comprising a plurality of semiconductor devices, wherein each one of said plurality of the semiconductor devices is repeatedly formed in a prescribed pattern on the semiconductor substrate, and comprises at least one unit region in which said magnetic loss member is formed.

15. A semiconductor substrate having a magnetic loss member formed over substantially entire surface of said semiconductor substrate including the back surface wherein said magnetic loss member has a granular structure, said magnetic loss member is composed of M-X—Y, where M is either any one of, or a mixture of, Fe, Co, and Ni, X is either an element other than M and Y, or a mixture thereof, Y is any one of, or a mixture of, F, N, and O, and M component is present in a concentration range exhibiting a saturation magnetization of 35 to 80% relative to the saturation magnetization of a bulk metal body consisting exclusively of the M component.

16. A semiconductor substrate having a plurality of magnetic loss members formed in a part thereof, wherein said magnetic loss members are formed in a prescribed pattern, each of said magnetic loss members being formed on the back surface of a semiconductor device and being formed on an inside surface of each semiconductor device region which is separated by dividing said semiconductor substrate, and has a granular structure, and is also composed of M-X—Y, where M is either any one of, or a mixture of, Fe, Co, and Ni, X is either an element other than M and Y, or a mixture thereof, Y is any one of, or a mixture of, F, N, and O, and M component is present in a concentration range exhibiting a saturation magnetization of 35 to 80% relative to the saturation magnetization of a bulk metal body consisting exclusively of the M component.

17. A semiconductor substrate formed by joining a first semiconductor substrate member and a second semiconductor substrate member together, and having a magnetic loss member formed in a part thereof, wherein at least one semiconductor substrate member of said first semiconductor substrate member and said second semiconductor substrate member is provided with at least one trench, which is formed on the surface thereof that is joined together; and said magnetic loss member is embedded inside said at least one trench, and on the back surface of a semiconductor device, and has a granular structure, and is also composed of M-X—Y, where M is either any one of, or a mixture of, Fe, Co, and Ni, X is either an element other than M and Y, or a mixture thereof, Y is any one of, or a mixture of, F, N, and O, and M component is present in a concentration range exhibiting a saturation magnetization of 35 to 80% relative to the saturation magnetization of a bulk metal body consisting exclusively of the M component.

18. The semiconductor substrate according to claim 17, wherein said trench comprises a plurality of trench portions formed in a prescribed pattern, each of said trench portions being formed on an inside surface of each semiconductor device region which is separated by dividing said semiconductor device.

19. The semiconductor substrate according to claim 17, wherein said first semiconductor substrate member and said second semiconductor substrate member consist essentially of silicon.

20. The semiconductor substrate according to claim 17, wherein said first semiconductor substrate member and said second semiconductor substrate member consist essentially of GaAs.

21. An electromagnetic noise suppression body comprising an electrically conductive soft magnetic thin film, wherein said soft magnetic thin film is also finely divided into configuring units sufficiently small relative to wavelength of electromagnetic noise so that conduction of DC current between those configuring units is interrupted, and said soft magnetic thin film is also composed of a composition of M-X—Y, where M is either any one of, or a mixture of, Fe, Co, and Ni, X is either an element other than M and Y, or a mixture thereof, Y is any one of, or a mixture of, F, N, and O and has a granular structure, and M component is present in a concentration range exhibiting a saturation magnetization of 35 to 80% relative to the saturation magnetization of a bulk metal body consisting exclusively of the M component.

22. The electromagnetic noise suppression body according to claim 21, wherein each of said configuring units has an aspect ratio of 10 or greater.

23. An electromagnetic noise suppression body for suppressing conductive electromagnetic noise, comprising an electrically conductive soft magnetic thin film attached in vicinity above a microstrip line or signal transmission line similar thereto, wherein said electrically conductive soft magnetic thin film is of a shape having a width that is substantially equivalent to or narrower than line width of said microstrip line or signal transmission line similar thereto, and has a granular structure and is also composed of a composition of M-X—Y, where M is at least one of Fe, Co, and Ni, X is at least one element other than M and Y, and Y is at least one of F, N, and O, and the M component is present in an amount effective to cause said film to exhibit a saturation magnetization of 35 to 80% relative to the saturation magnetization of a bulk metal body consisting exclusively of the M component.

24. The electromagnetic noise suppression body according to claim 23, wherein said electromagnetic noise suppression body is attached so that the axis of hard magnetization thereof is substantially parallel to the width direction of said microstrip line or signal transmission line similar thereto.

25. The electromagnetic noise suppression body according to claim 23, wherein said soft magnetic thin film of a shape having a width that is substantially equivalent to or narrower than line width of said microstrip line or analogous signal transmission line has an aspect ratio in width direction of 10 or greater.

* * * * *